(12) United States Patent
Mei

(10) Patent No.: US 12,543,427 B2
(45) Date of Patent: Feb. 3, 2026

(54) LIGHT EMITTING DEVICE AND MANUFACTURING METHOD THEREOF, DISPLAY SUBSTRATE AND DISPLAY APPARATUS

(71) Applicants: Beijing BOE Technology Development Co., Ltd., Beijing (CN); BOE TECHNOLOGY GROUP CO., LTD., Beijing (CN)

(72) Inventor: Wenhai Mei, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 709 days.

(21) Appl. No.: 17/913,224

(22) PCT Filed: Aug. 27, 2021

(86) PCT No.: PCT/CN2021/115151
§ 371 (c)(1),
(2) Date: Mar. 2, 2023

(87) PCT Pub. No.: WO2023/024113
PCT Pub. Date: Mar. 2, 2023

(65) Prior Publication Data
US 2024/0237379 A1 Jul. 11, 2024

(51) Int. Cl.
*H10K 50/115* (2023.01)
*C09K 11/06* (2006.01)
*H10K 71/12* (2023.01)
*H10K 85/60* (2023.01)

(52) U.S. Cl.
CPC ............ *H10K 50/115* (2023.02); *C09K 11/06* (2013.01); *H10K 71/12* (2023.02); *H10K 85/631* (2023.02)

(58) Field of Classification Search
None
See application file for complete search history.

(56) References Cited

FOREIGN PATENT DOCUMENTS

| CN | 108550707 A | 9/2018 |
|----|-------------|--------|
| CN | 109935719 A | 6/2019 |
| CN | 109935736 A | 6/2019 |
| CN | 110289360 A | 9/2019 |

*Primary Examiner* — Anthony Ho
(74) *Attorney, Agent, or Firm* — HOUTTEMAN LAW LLC

(57) ABSTRACT

The present disclosure provides a light emitting device, a manufacturing method thereof, a display substrate, and a display apparatus. The light emitting device includes a first carrier transport layer, a light emitting layer and a second carrier transport layer sequentially stacked on a substrate, wherein the light emitting layer includes at least two quantum dot film layers, each of which includes quantum dots; the quantum dot film layer close to the first carrier transport layer further includes carrier auxiliary ligands, each of which is configured to be attached to a surface of a body of the quantum dot, and/or the quantum dot film layer close to the second carrier transport layer further includes carrier auxiliary ligands, each of which is configured to be attached to a surface of a body of the quantum dot.

19 Claims, 13 Drawing Sheets

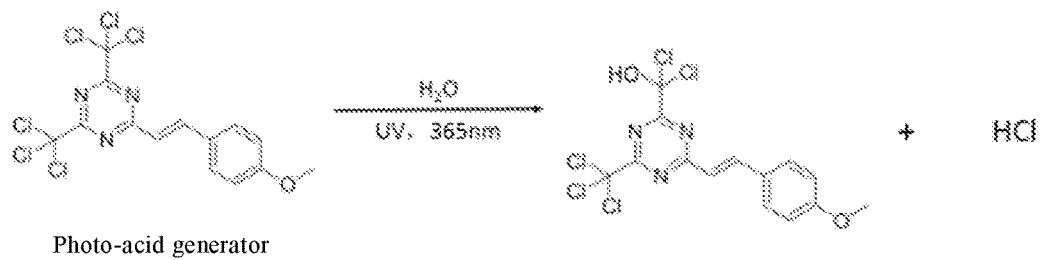

Photo-acid generator

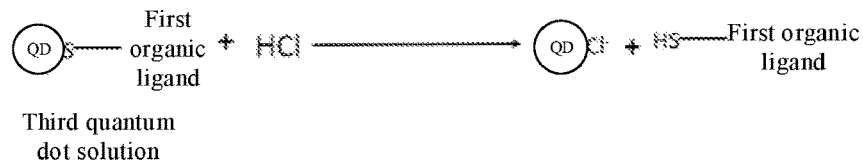

Third quantum dot solution

FIG. 10

```
S71 — Providing a substrate
         ↓
S72 — Forming a first electrode on the substrate
         ↓
S73 — Forming a hole injection layer on a side of the first
       electrode away from the substrate
         ↓
S74 — Forming a first carrier transport layer on a side of the hole
       injection layer away from the substrate
         ↓
S75 — Forming a light emitting layer on a side of the first carrier
       transport layer away from the substrate
         ↓
S76 — Forming a second carrier transport layer on a side of the
       light emitting layer away from the substrate
         ↓
S77 — Forming a second electrode on a side of the second carrier
       transport layer away from the substrate
```

FIG. 11

LIGHT EMITTING DEVICE AND MANUFACTURING METHOD THEREOF, DISPLAY SUBSTRATE AND DISPLAY APPARATUS

TECHNICAL FIELD

The present disclosure relates to the field of display technology, in particular to a light emitting device and a manufacturing method thereof, a display substrate and a display apparatus.

BACKGROUND

A quantum dot light emitting diode display (QLED) device is a novel display technology developed on the basis of an organic light emitting diode display (OLED) device. The QLED device is different from the OLED device in that a light emitting layer in the QLED device is a quantum dot layer. A light emitting principle of the QLED device is that electrons are injected into the quantum dot layer through an electron transport layer, holes are injected into the quantum dot layer through a hole transport layer, and the electrons and the holes are recombined in the quantum dot layer to emit light. Compared with the OLED device, the QLED device has the advantages of narrow light emitting peak, high color saturation, wide color gamut and the like.

SUMMARY

The embodiments of the present disclosure provide a light emitting device, a manufacturing method thereof, a display substrate and a display apparatus.

According to a first aspect of the present disclosure, the present disclosure provides a light emitting device, including a first carrier transport layer, a light emitting layer and a second carrier transport layer sequentially stacked on a substrate, where the light emitting layer includes at least two quantum dot film layers, and each of the at least two quantum dot film layers includes quantum dots; where the quantum dot film layer of the at least two quantum dot film layers close to the first carrier transport layer further includes carrier auxiliary ligands, each of which is configured to be attached to a surface of a body of the quantum dot, and/or the quantum dot film layer of the at least two quantum dot film layers close to the second carrier transport layer further includes carrier auxiliary ligands, each of which is configured to be attached to a surface of a body of the quantum dot.

In some embodiments, a thickness of each of at least one quantum dot film layer in the at least two quantum dot film layers is less than that of the first carrier transport layer; and/or, a thickness of each of at least one quantum dot film layer in the at least two quantum dot film layers is less than that of the second carrier transport layer.

In some embodiments, bodies of the quantum dots of the at least two quantum dot film layers are all made of a same material, and at least two quantum dot film layers includes ligands made of different materials.

In some embodiments, the carrier auxiliary ligands in either the quantum dot film layer close to the first carrier transport layer or the quantum dot film layer close to the second carrier transport layer include an inorganic ligand or an organic ligand.

In some embodiments, the organic ligand includes a second organic ligand; and a structural formula of the second organic ligand is

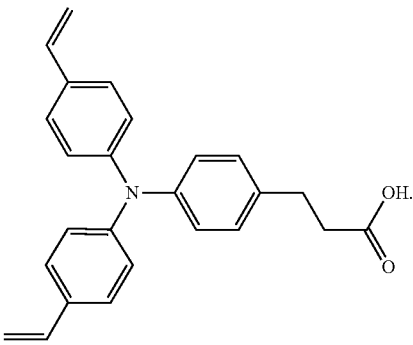 [SMILES: C=Cc1ccc(N(c2ccc(C=C)cc2)c2ccc(CCC(=O)O)cc2)cc1]

In some embodiments, the inorganic ligand includes a halogen element or a chalcogen element.

In some embodiments, a chemical formula of the inorganic ligand includes $K^-$;
where K is a halogen element.

In some embodiments, K includes any one of iodine, chlorine, bromine or fluorine.

In some embodiments, a chemical formula of the inorganic ligand includes $ABx^{y-}$; where B is a chalcogen element, and both of x and y are positive integers.

In some embodiments, A includes any one of molybdenum, chromium, tungsten, iron, ruthenium, osmium, cobalt, rhodium, aluminum, gallium, indium, arsenic, or phosphorus, and B includes a chalcogen element.

In some embodiments, a chemical formula of the inorganic ligand includes $M_zJ_x^{y-}$; where M is a metal element, J is a chalcogen element, and all of x, y and z are positive integers.

In some embodiments, M includes any one of germanium, tin, lead, stibium, or bismuth, and J includes oxygen element.

In some embodiments, the quantum dot film layers other than the quantum dot film layers including the carrier auxiliary ligands further include organic ligands, each of which is configured to be attached to a surface of a body of the quantum dot.

In some embodiments, each of the at least two quantum dot film layers is formed by initial organic ligands, attached to surfaces of bodies of the quantum dots, subjected to a reaction.

In some embodiments, the initial organic ligands include any one of a first organic ligand or a third organic ligand; where a structural formula of the first organic ligand is

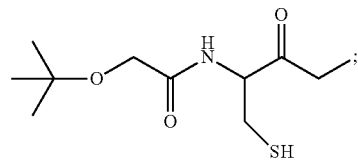

and a structural formula of the third organic ligand is

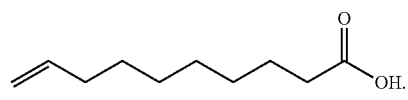

In some embodiments, each of the at least two quantum dot film layers has a thickness in a range from 1 nm to 15 nm.

In some embodiments, the light emitting layer has a thickness in a range from 30 nm to 50 nm.

In some embodiments, the light emitting device further includes: a first electrode between the substrate and the first carrier transport layer; and a second electrode on a side of the second carrier transport layer away from the substrate; where one of the first carrier transport layer and the second carrier transport layer is an electron transport layer, and the other of the first carrier transport layer and the second carrier transport layer is a hole transport layer.

In some embodiments, one of the first electrode and the second electrode is an anode and the other of the first electrode and the second electrode is a cathode; in response to that the first electrode is an anode and the second electrode is a cathode, the first carrier transport layer is a hole transport layer, and the second carrier transport layer is an electron transport layer; in response to that the first electrode is a cathode and the second electrode is an anode, the first carrier transport layer is an electron transport layer, and the second carrier transport layer is a hole transport layer.

According to a second aspect of the present disclosure, an embodiment of the present disclosure provides a display substrate, including a plurality of pixel units, each of which includes a plurality of light emitting devices, and each of the plurality of light emitting devices adopts the above light emitting device.

According to a third aspect of the present disclosure, an embodiment of the present disclosure provides a display apparatus, including the display substrate described above.

According to a fourth aspect of the present disclosure, an embodiment of the present disclosure provides a method for manufacturing a light emitting device, including: providing a substrate; forming a first carrier transport layer on a side of the substrate; forming a light emitting layer on a side of the first carrier transport layer away from the substrate; and forming a second carrier transport layer on a side of the light emitting layer away from the first carrier transport layer; where the light emitting layer includes at least two quantum dot film layers, and each of the at least two quantum dot film layers includes quantum dots; and the quantum dot film layer of the at least two quantum dot film layers close to the first carrier transport layer further includes carrier auxiliary ligands, each of which is configured to be attached to a surface of a body of the quantum dot, and/or the quantum dot film layer of the at least two quantum dot film layers close to the second carrier transport layer further includes carrier auxiliary ligands, each of which is configured to be attached to a surface of a body of the quantum dot.

In some embodiments, the carrier auxiliary ligands in either the quantum dot film layer close to the first carrier transport layer or the quantum dot film layer close to the second carrier transport layer include inorganic ligands, which are formed on surfaces of bodies of the quantum dots in a manner in which: a photo-acid generator and initial organic ligands attached to the surfaces of the bodies of the quantum dots react under an illumination environment to generate inorganic ions, and the inorganic ions are formed on the surfaces of the bodies of the quantum dots in a ligand exchange mode.

In some embodiments, in response to that any one of the quantum dot film layers has organic ligands attached to the surfaces of the bodies of the quantum dots, forming the quantum dot film layer by: forming a quantum dot solution including initial organic ligands attached to the surfaces of the bodies of the quantum dots; and causing the initial organic ligands attached to the surfaces of the bodies of the quantum dots to be subjected to a reaction, under an illumination environment, by improving solubility or through crosslinking, to form the quantum dot film layer.

BRIEF DESCRIPTION OF DRAWINGS

The accompanying drawings, which are provided for further understanding of the present disclosure and constitute a part of this specification, are for explaining the present disclosure together with the following exemplary embodiments, but are not intended to limit the present disclosure. In the drawings:

FIG. 10 is a schematic diagram illustrating that a photo-acid generator generates chloride ions under illumination and the chloride ions react with quantum dots to realize ligand exchange.

FIG. 11 is a flowchart of a method for manufacturing a light emitting device with an upright structure in an embodiment of the present disclosure.

DETAIL DESCRIPTION OF EMBODIMENTS

In order to enable one of ordinary skill in the art to better understand the technical solutions of the embodiments of the present disclosure, the technical solutions of a light emitting device and a manufacturing method thereof, a display substrate and a display apparatus according to the embodiments of the present disclosure will be described clearly and fully with reference to the accompanying drawings of the embodiments of the present disclosure.

The example embodiments will be described more fully hereinafter with reference to the accompanying drawings, but the example embodiments shown may be embodied in different forms and should not be construed as limited to the embodiments set forth herein. Rather, these embodiments are provided so that this disclosure will be thorough and complete, and will fully convey the scope of the present disclosure to one ordinary skill in the art.

The terms used herein are for the purpose of describing particular embodiments only and are not intended to limit the present disclosure. As used herein, the singular forms "a", "an" and "the" are intended to include a plural form as well, unless the context clearly indicates otherwise. It should be further understood that, the terms of "including" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first, second, etc. may be used herein to describe various elements/structures, these elements/structures should not be limited by these terms. These terms are only used to distinguish one element/structure from another element/structure.

Unless otherwise defined, all terms (including technical and scientific terms) used herein have the same meaning as commonly understood by one of ordinary skill in the art. It should be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Figure 1:
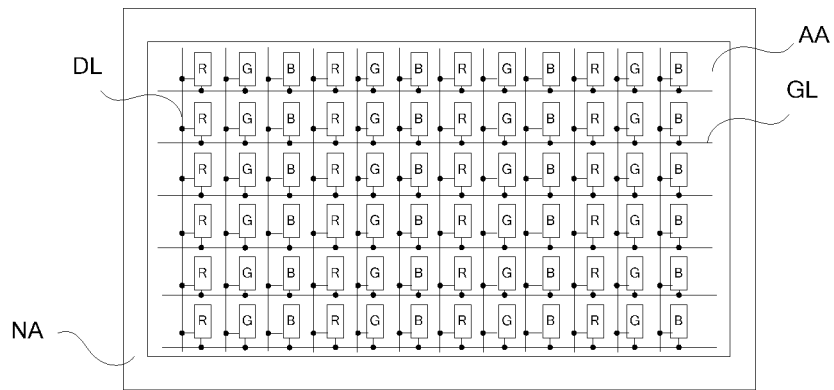
FIG. 1 is a schematic plan view of a display substrate in the related art.

FIG. 1 is a schematic plan view of a display substrate in the related art. As shown in FIG. 1, the display substrate has a display area AA and a non-display area NA located outside the display area AA. A plurality of scanning lines GL and a plurality of data lines DL are arranged in the display area AA; the plurality of scanning lines GL and the plurality of data lines DL are arranged in an intersecting manner to define a plurality of sub-pixels. Illustratively, every three adjacent sub-pixels in a row direction form one pixel unit, and these three adjacent sub-pixels (e.g., a red sub-pixel R, a green sub-pixel G, and a blue sub-pixel B) are used to display different colors. The sub-pixels in a same row are provided with a scanning signal by a same scanning line GL, and the sub-pixels in a same column are provided with data voltage signals by a same data line DL. A gate driving circuit and a driving chip (not shown) may be provided in the non-display area NA, the scanning lines GL are connected to the gate driving circuit, and the data lines DL are connected to the driving chip.

Each sub-pixel includes a light emitting device and a pixel circuit. The pixel circuit is connected to a scanning line GL and a data line DL, and is configured to supply a driving signal to the light emitting device according to electrical signals supplied from the scanning line GL and the data line DL to drive the light emitting device to display. For example, the pixel circuit includes at least a writing transistor and a driving transistor; a gate electrode of the writing transistor is connected to the scanning line GL; the writing transistor is configured to transmit a data voltage signal provided by the data line DL to a gate electrode of the driving transistor in response to control of a scanning signal provided by the scanning line GL, and the driving transistor is configured to supply a driving current to the light emitting device according to a voltage difference between the gate electrode and a first electrode of the driving transistor, so that the light emitting device displays. It should be noted that the writing transistor and the driving transistor may be thin film transistors, each of which includes a gate electrode, a first electrode and a second electrode, where one of the first electrode and the second electrode is a source electrode, and the other is a drain electrode.

In the related art, the display substrate may be a QLED display substrate, and in the light emitting device of the QLED display substrate, a light emitting layer is a quantum dot layer. On the other hand, in a method for manufacturing a patterned quantum dot layer by using a direct lithography method, the problem of quantum dot residue is relatively serious, mainly because ligands on a surface of a body of a quantum dot (a quantum dot body) are dynamically adsorbed and desorbed in the presence of a solvent, and when the quantum dot layer is washed, a developing solvent washes away the quantum dots and also washes away some ligands of the quantum dots, so that the solubility of the quantum dots in the developing solvent is reduced due to the reduction of the number of the ligands, and finally the residue of the quantum dots on a previous film layer (such as an electron transport layer or a hole transport layer) is caused, and a problem of color mixing in display of a full-color QLED occurs. The ligand of the quantum dot is usually an organic ligand, such as ethanolamine, and the ligand is used for protecting the quantum dot and preventing the quantum dot from being directly exposed.

On the other hand, an electron transport and injection capability and a hole transport and injection capability of the light emitting device are generally different. For example, the hole transport and injection capability of the light emitting device is inferior to the electron transport and injection capability, or the electron transport and injection capability of the light emitting device is inferior to the hole transport and injection capability, so that the electron injection and hole injection of the light emitting device are unbalanced, and the light emitting effect of the light emitting device is affected.

Figure 2:
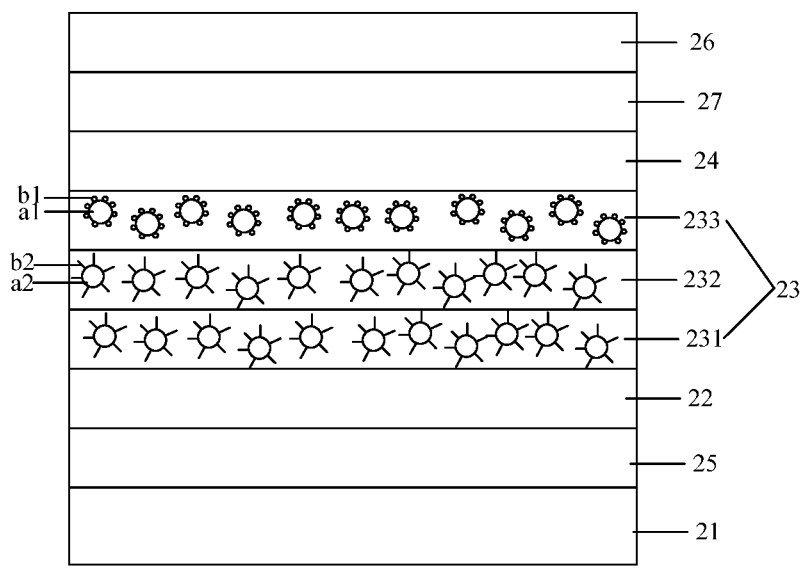
FIG. 2 is a schematic diagram of a structure of a light emitting device according to an embodiment of the present disclosure.

In view of this, the present disclosure provides a light emitting device. FIG. 2 is a schematic diagram of a structure of a light emitting device according to an embodiment of the present disclosure. As shown in FIG. 2, the light emitting device includes: a substrate 21, and a first carrier transport layer 22, a light emitting layer 23, and a second carrier transport layer 24 on the substrate; the first carrier transport layer 22 is provided on a side of the substrate 21; the light emitting layer 23 is provided on a side of the first carrier transport layer 22 away from the substrate 21; the second carrier transport layer 24 is provided on a side of the light emitting layer 23 away from the substrate 21; the light emitting layer 23 includes at least two quantum dot film layers sequentially stacked on the side of the first carrier transport layer 22 away from the substrate 21, and each quantum dot film layer includes quantum dots and quantum dot ligands attached to a surface of each quantum dot body.

The quantum dot ligands contained in the quantum dot film layer disposed close to the first carrier transport layer 22 are carrier auxiliary ligands, and/or the quantum dot ligands contained in the quantum dot film layer disposed close to the second carrier transport layer 24 are carrier auxiliary ligands.

The carrier auxiliary ligand is used for improving the injection or transport of carriers (such as holes or electrons) so as to improve the light emitting efficiency. In an embodiment of the present disclosure, the carrier auxiliary ligand may include an inorganic ligand, which is an inorganic ion ligand facilitating injection and transport of carriers, such as a chloride ion; or an organic ligand, which is an organic ligand facilitating injection and transport of carriers, such as triphenylamine.

In an embodiment of the present disclosure, how to modify the ligands of each quantum dot film layer is determined according to the unbalanced condition of carrier transport of the light emitting device. Specifically, in a case where the injection capability of the carriers transmitted by the first carrier transport layer 22 is insufficient, the quantum dot ligands contained in the quantum dot film layer disposed close to the first carrier transport layer 22 are carrier auxiliary ligands, which may reduce the insulating properties of the light emitting layer 23, and increase injection and transport rates of the carriers transmitted by the first carrier transport layer 22, thereby increasing the injection capability of the carriers transmitted by the first carrier transport layer 22, so that a balance between the injection of the carriers transmitted by the first carrier transport layer 22 and the injection of the carriers transmitted by the second carrier transport layer 24 is realized.

In a case where the injection capability of the carriers transmitted by the second carrier transport layer 24 is insufficient, the quantum dot ligands contained in the quantum dot film layer disposed close to the second carrier transport layer 24 are carrier auxiliary ligands, which may reduce the insulating properties of the light emitting layer 23, and increase injection and transport rates of the carriers transmitted by the second carrier transport layer 24, thereby increasing the injection capability of the carriers transmitted by the second carrier transport layer 24, so that a balance between the injection of the carriers transmitted by the first carrier transport layer 22 and the injection of the carriers transmitted by the second carrier transport layer 24 is realized.

In a case where both of the injection capability of the carriers transmitted by the first carrier transport layer 22 and the injection capability of the carriers transmitted by the second carrier transport layer 24 are insufficient, the quantum dot ligands contained in the quantum dot film layer disposed close to the first carrier transport layer 22 and the quantum dot ligands contained in the quantum dot film layer disposed close to the second carrier transport layer 24 are both carrier auxiliary ligands, which may reduce the insulating properties of the light emitting layer 23, thereby increasing both of the injection capability of the carriers transmitted by the first carrier transport layer 22 and the injection capability of the carriers transmitted by the second carrier transport layer 24.

In an embodiment of the present disclosure, for other quantum dot film layers except for the quantum dot film layer containing the carrier auxiliary ligands, the quantum dot ligands contained in the other quantum dot film layers are organic ligands, and the organic ligands may be organic ligands including double bonds.

In an embodiment of the present disclosure, each quantum dot film layer is formed by initial organic ligands, attached to the surface of the quantum dot body, subjected to a reaction.

In some embodiments, the quantum dot bodies of quantum dot film layers are made of a same material, and the ligands of at least two quantum dot film layers are made of different materials.

In an embodiment of the present disclosure, in the light emitting layer 23, the number of quantum dot film layers may be three or more. FIG. 2 exemplarily shows that the light emitting layer 23 contains three quantum dot film layers. The embodiment of the present disclosure includes this case, but is not limited thereto.

Illustratively, as shown in FIG. 2, the three quantum dot film layers are a first quantum dot film layer 231, a second quantum dot film layer 232, and a third quantum dot film layer 233, which are sequentially stacked. Specifically, the first quantum dot film layer 231 is disposed on the side of the first carrier transport layer 22 away from the substrate 21, the second quantum dot film layer 232 is disposed on a side of the first quantum dot film layer 231 away from the substrate 21, the third quantum dot film layer 233 is disposed on a side of the second quantum dot film layer 232 away from the substrate 21, and the second carrier transport layer 24 is disposed on a side of the third quantum dot film layer 233 away from the substrate 21.

In some embodiments, the quantum dot ligands of the first quantum dot film layer 231 are inorganic ligands, the quantum dot ligands of the second quantum dot film layer 232 are organic ligands, and the quantum dot ligands of the third quantum dot film layer 233 are organic ligands. In some embodiments, the quantum dot ligands of the first quantum dot film layer 231 are organic ligands, the quantum dot ligands of the second quantum dot film layer 232 are organic ligands, and the quantum dot ligands of the third quantum dot film layer 233 are inorganic ligands. In some embodiments, the quantum dot ligands of the first quantum dot film layer 231 are inorganic ligands, the quantum dot ligands of the second quantum dot film layer 232 are organic ligands, and the quantum dot ligands of the third quantum dot film layer 233 are inorganic ligands.

In an embodiment of the present disclosure, quantum dot ligands contained in different quantum dot film layers have different energy levels of frontier orbitals and different mobilities, respectively, where the frontier orbital is a highest occupied molecular orbital (HOMO) or a lowest unoccupied molecular orbital (LUMO), so that at least two quantum film layers of the light emitting layer 23 form a structure having progressive energy levels and progressive mobilities, which is beneficial to realizing the a balance between the injections of the carriers.

In an embodiment of the present disclosure, as shown in FIG. 2, the light emitting device further includes a first electrode 25 and a second electrode 26, the first electrode 25 is disposed between the substrate 21 and the first carrier transport layer 22, and the second electrode 26 is disposed on a side of the second carrier transport layer 24 away from the substrate 21.

In an embodiment of the present disclosure, one of the first carrier transport layer 22 and the second carrier transport layer 24 is an electron transport layer, and the other of the first carrier transport layer 22 and the second carrier transport layer 24 is a hole transport layer. One of the first electrode 25 and the second electrode 26 is an anode, and the other of the first electrode 25 and the second electrode 26 is a cathode.

In an embodiment of the present disclosure, the light emitting device may be a top-emitting structure or a bottom-emitting structure, which may be specifically determined according to actual needs, and is not limited herein. For example, in a case where the light emitting device is a top-emitting structure, the second electrode 26 may be made of a transparent material or a semi-transparent material, and specifically may be made of an indium tin oxide (ITO) material or a metal material with a smaller thickness; the first electrode 25 may be made of a metal material, such as copper. In contrast, in a case where the light emitting device is a bottom-emitting structure, the first electrode 25 may be made of a transparent material, and the second electrode 26 may be made of a metal material.

In an embodiment of the present disclosure, the light emitting device may have an upright structure or an inverted structure. For example, in a case where the light emitting device has the upright structure, the first electrode 25 is an anode, the second electrode 26 is a cathode, the first carrier transport layer 22 is a hole transport layer, and the second carrier transport layer 24 is an electron transport layer; in a case where the light emitting device has the inverted structure, the first electrode 25 is a cathode, the second electrode 26 is an anode, the first carrier transport layer 22 is an electron transport layer, and the second carrier transport layer 24 is a hole transport layer.

In some embodiments, the light emitting device further includes a hole injection layer 27, as shown in FIG. 2. In a case where the light emitting device has the upright structure, the hole injection layer 27 is disposed between the first electrode 25 and the first carrier transport layer 22. In a case where the light emitting device has the inverted structure, the hole injection layer 27 is disposed between the second electrode 26 and the second carrier transport layer 24. FIG. 2 exemplarily shows a case where the light emitting device has an inverted structure, but the embodiment of the present disclosure is not limited thereto.

In some embodiments, a material of the quantum dots in the quantum dot film layer may include an inorganic quantum dot material, and the quantum dot body has an inorganic core-shell structure. The quantum dot material may be, for example, cadmium sulfide (CdS), cadmium selenide (CdSe), cadmium telluride (CdTe), zinc selenide (ZnSe), indium phosphide (InP), lead sulfide (PbS), copper indium sulfide (CuInS$_2$), zinc oxide (ZnO), cesium lead chloride (CsPbCl$_3$), cesium lead bromide (CsPbBr$_3$), cesium lead iodide (CsPbI$_3$), cadmium sulfide/zinc sulfide (CdS/ZnS), cadmium selenide/zinc sulfide (CdSe/ZnS), indium phosphide/zinc sulfide (InP/ZnS), lead sulfide/zinc sulfide (PbS/ZnS), cesium lead chloride/zinc sulfide (CsPbCl$_3$/ZnS), cesium lead bromide/zinc sulfide (CsPbBr$_3$/ZnS), cesium lead iodide/zinc sulfide (CsPhI$_3$/ZnS), indium arsenide (InAs), indium gallium arsenide (InGaAs), indium gallium nitride (InGaN), gallium nitride (GaN), zinc telluride (ZnTe), silicon (Si), germanium (Ge), carbon (C), or the like, as well as other nanoscale materials having the above compositions, such as nanorods, nanosheets.

In some embodiments, in a case where the light emitting device has an inverted structure, the second carrier transport layer 24 is a hole transport layer. For example, a material of the hole transport layer may include poly(9,9-dioctylfluorene-co-N-(4-butylphenyl)diphenylamine) (TFB), or polyvinylcarbazole (PVK).

In some embodiments, in a case where the light emitting device has an upright structure, the first carrier transport layer 22 is a hole transport layer. For example, the material of the hole transport layer may include one or more of nickel oxide, tungsten oxide, cuprous oxide, and molybdenum oxide. For example, the hole transport layer may be a thin film of nickel oxide nanoparticle, a thin film of nickel oxide sol-gel, or the like.

In some embodiments, a material of the hole injection layer 27 may include poly(3,4-ethylenedioxythiophene)-polystyrene sulfonic acid (PEDOT/PSS), for example.

In some embodiments, for example, a material of the electron transport layer may include one or more of zinc oxide, magnesium zinc oxide, aluminum zinc oxide, lithium zinc oxide, titanium oxide, and aluminum oxide. For example, the electron transport layer may be a thin film of zinc oxide nanoparticle, a thin film of zinc oxide sol-gel, or the like.

Figure 3:
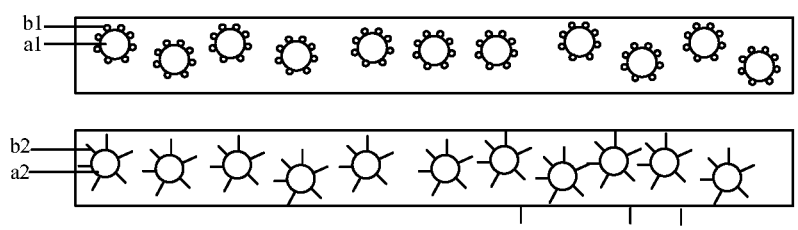
FIG. 3 is a schematic diagram of a structure of a quantum dot film layer containing an inorganic ligand and a quantum dot film layer containing an organic ligand.

FIG. 3 is a schematic diagram of a structure of a quantum dot film layer containing an inorganic ligand and a quantum dot film layer containing an organic ligand. As shown in FIG. 3, the quantum dot film layer containing inorganic ligands includes a plurality of quantum dots a1 and a plurality of inorganic ligands b1, where multiple inorganic ligands b1 are attached to a surface of each quantum dot a1; and the quantum dot film layer containing organic ligands includes a plurality of quantum dots a2 and a plurality of organic ligands b2, where multiple organic ligands b2 are attached to a surface of each quantum dot a2.

In an embodiment of the present disclosure, the inorganic ligand b1 may contain a halogen element or a chalcogen element, and may further contain a metal element.

In some embodiments, in a case where the inorganic ligand b1 includes a halogen element, the chemical formula of the inorganic ligand b1 may be K$^-$, where K is a halogen element. Illustratively, K may specifically include any one of iodine (I), chlorine (Cl), bromine (Br), and fluorine (F). For example, the inorganic ligand b1 may be Cl$^-$.

In some embodiments, in a case where the inorganic ligand a1 includes a chalcogen element, the chemical formula of the inorganic ligand b1 may be ABx$^{y-}$, where A is a metal element or a non-metal element, B is a chalcogen element, and both of x and y are positive integers. Illustratively, A may include any one of molybdenum (Mo), chromium (Cr), tungsten (W), iron (Fe), ruthenium (Ru), osmium (Os), cobalt (Co), rhodium (Rh), aluminum (Al), gallium (Ga), indium (In), arsenic (As), phosphorus (P); B includes oxygen (O), and a combination of x and y may include: {x=4, y=2}, {x=3, y=2}, {x=2, y=2}, and {x=2, y=1}. For example, the inorganic ligand b1 is MoO$_4^{2-}$, CrO$_3^{2-}$, AlO$_2^{2-}$, FeO$_2^-$, or the like.

In some embodiments, in a case where the inorganic ligand b1 includes a chalcogen element, the chemical formula of the inorganic ligand b1 may include M$_z$J$_x^{y-}$, where M is a metal element, J is a chalcogen element, and all of x, y and z are positive integers. Specifically, illustratively, J includes oxygen (O) and M includes any one of germanium (Ge), tin (Sn), lead (Pb), stibium (Sb), bismuth (Bi); a combination of z, x, and y may include: {z=2, x=3, y=2}, and {z=2, x=6, y=4}. For example, the inorganic ligand b1 is Sn$_2$O$_3^{2-}$, or the like.

The inorganic ligand b1 may be obtained by oxidizing an initial inorganic ligand including a non-oxygen element in the chalcogen elements and a metal element (such as oxidation reaction of the initial inorganic ligand with oxygen plasma), where the chemical formula of the initial inorganic ligand may be M'2J'x'', where M' is a metal element. For example, M' may include any one of germanium (Ge), tin (Sn), lead (Pb), stibium (Sb) and bismuth (Bi). J' is a non-oxygen element in the chalcogen elements. For example, J' may include any one of sulfur (S), selenium (Se) and tellurium (Te), and all of x, y and z are positive integers.

In some embodiments, the organic ligand b2 may be a ligand that facilitates the hole transport, and include, but be not limited to, an arylamine-based organic ligand, carbazole-based organic ligands, or the like.

In some embodiments, the organic ligand b2 may be a ligand that facilitates the electron transport, and include, but be not limited to, a fluorene-based organic ligand, a pyridine-based organic ligand, or the like.

In an embodiment of the present disclosure, for the case where the hole injection capability is insufficient, the organic ligand b2 may employ a ligand that facilitates the hole transport; for the case where the electron injection capability is insufficient, the organic ligand b2 may be a ligand that facilitates the electron transport.

In some embodiments, the carrier auxiliary ligand is an organic ligand; and the organic ligand may include a second organic ligand which facilitates transport and injection of the carrier (such as the hole or the electron); the second organic ligand may be a ligand having a main chain, which is an organic chain that facilitates transport and injection of the carrier, and a terminal containing a group capable of undergoing crosslinking under the initiation of a photo-crosslinking initiator; the group may be an alkene, an alkyne, an epoxy, or the like; and the organic chain may be an aniline-based, a carbazole-based, or a fluorene-based organic chain. For example, the second organic ligand may adopt triphenylamine, and the structural formula of the second organic ligand may be:

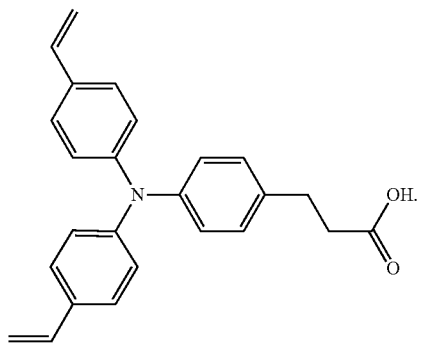 [SMILES: C=Cc1ccc(N(c2ccc(C=C)cc2)c2ccc(CCC(=O)O)cc2)cc1]

Figure 4:
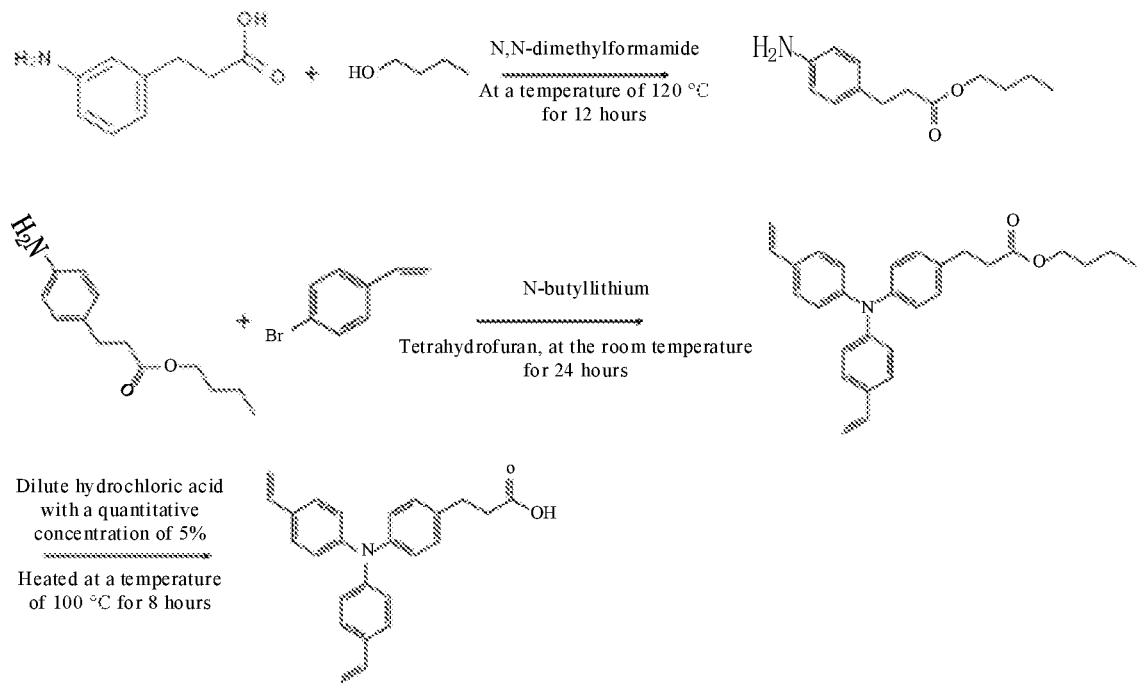
FIG. 4 is a schematic diagram of a synthesis of a second organic ligand.

Illustratively, FIG. 4 is a schematic diagram of a synthesis of a second organic ligand. The structural formula of the second organic ligand is

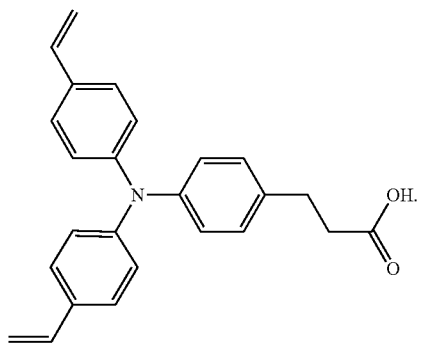 [SMILES: C=Cc1ccc(N(c2ccc(C=C)cc2)c2ccc(CCC(=O)O)cc2)cc1]

As shown in FIG. 4, firstly,

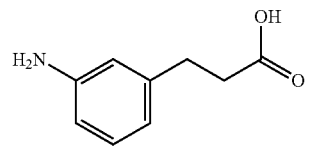 [SMILES: Nc1cccc(CCC(=O)O)c1]

reacts with

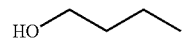

at a temperature of 120° C. in the presence of N,N-dimethylformamide for 12 hours, thereby producing

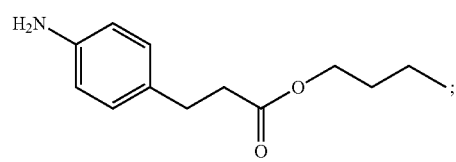 [SMILES: CCCCOC(=O)CCc1ccc(N)cc1]

then,

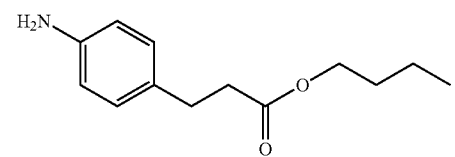 [SMILES: CCCCOC(=O)CCc1ccc(N)cc1]

reacts with

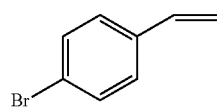

at the room temperature in a solvent containing n-butyllithium and tetrahydrofuran for 24 hours, thereby producing

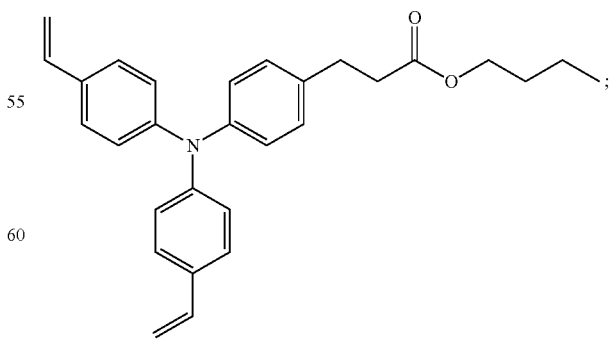

finally,

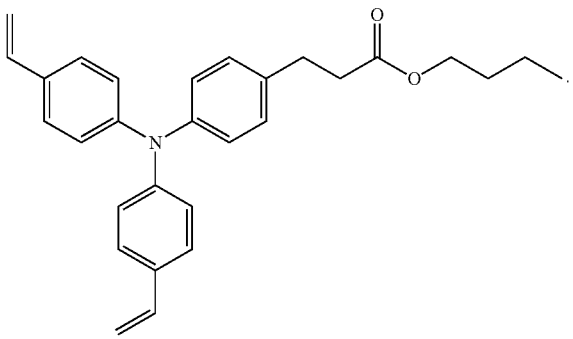 [SMILES: C=Cc1ccc(N(c2ccc(C=C)cc2)c2ccc(CCC(=O)OCCCC)cc2)cc1]

is heated at a temperature of 100° C. in a dilute hydrochloric acid with a quantitative concentration of 5% for 8 hours, thereby obtaining the second organic ligand. That is,

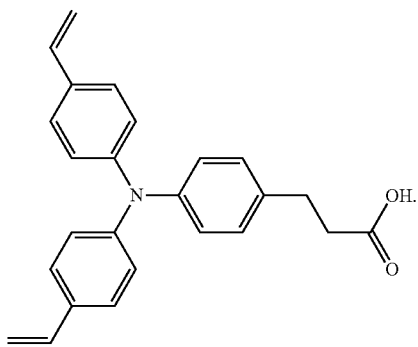 [SMILES: C=Cc1ccc(N(c2ccc(C=C)cc2)c2ccc(CCC(=O)O)cc2)cc1]

In some embodiments, each quantum dot film layer is formed by initial organic ligands, attached to the surface of the quantum dot body, subjected to a reaction. The initial organic ligand may include any one of a first organic ligand or a third organic ligand.

Illustratively, the structural formula of the first organic ligand is

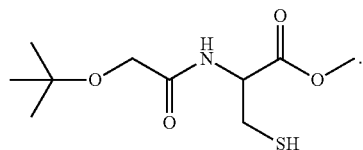 [SMILES: COC(=O)C(CS)NC(=O)COC(C)(C)C]

In some embodiments, the third organic ligand is a ligand having a main chain, which is a normal alkane organic chain, and a terminal containing a group capable of undergoing crosslinking under the initiation of an initiator; the group may be an alkene, an alkyne, an epoxy, or the like.

Illustratively, the structural formula of the third organic ligand is

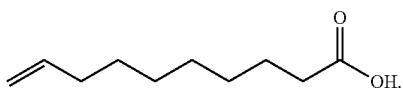

In some embodiments, a thickness of each of at least one quantum dot film layer is less than that of the first carrier transport layer 22; and/or the thickness of each of the at least one quantum dot film layer is less than that of the second carrier transport layer 24. In some embodiments, a thickness of each quantum dot film layer is less than that of the first electrode 25 or the second electrode 26.

In an embodiment of the present disclosure, in the light emitting layer 23, the thickness of each quantum dot film layer is in a range from 1 nm to 15 nm, and the thickness of the quantum dot film layer refers to a thickness of the quantum dot film layer in a vertical direction as shown in FIG. 2. In some embodiments, the thickness of each quantum dot film layer is in a range from 1 nm to 10 nm.

In an embodiment of the present disclosure, a thickness of the light emitting layer 23 is in a range from 30 nm to 50 nm, and the thickness of the light emitting layer 23 refers to a sum of thicknesses of at least two quantum dot film layers contained in the light emitting layer 23. The thickness of the light emitting layer 23 is 30 nm, for example.

In an embodiment of the present disclosure, in a manufacturing process of a patterned quantum dot film layer, each quantum dot film layer is thin, so that the developed quantum dots have a less residue, and thus the problem of color mixing in display caused by the residual quantum dots is effectively improved.

In some embodiments, the light emitting device is a red quantum dot light emitting device for emitting red light, the light emitting layer 23 may be a red light emitting layer. Accordingly, the quantum dot film layers in the light emitting layer 23 are red light quantum dot film layers. In some embodiments, the light emitting device is a green quantum dot light emitting device for emitting green light, the light emitting layer 23 may be a green light emitting layer. Accordingly, the quantum dot film layers in the light emitting layer 23 are green light quantum dot film layers. In some embodiments, the light emitting device is a blue quantum dot light emitting device for emitting blue light, the light emitting layer 23 may be a blue light emitting layer. Accordingly, the quantum dot film layers in the light emitting layer 23 are blue light quantum dot film layers.

Figure 5:
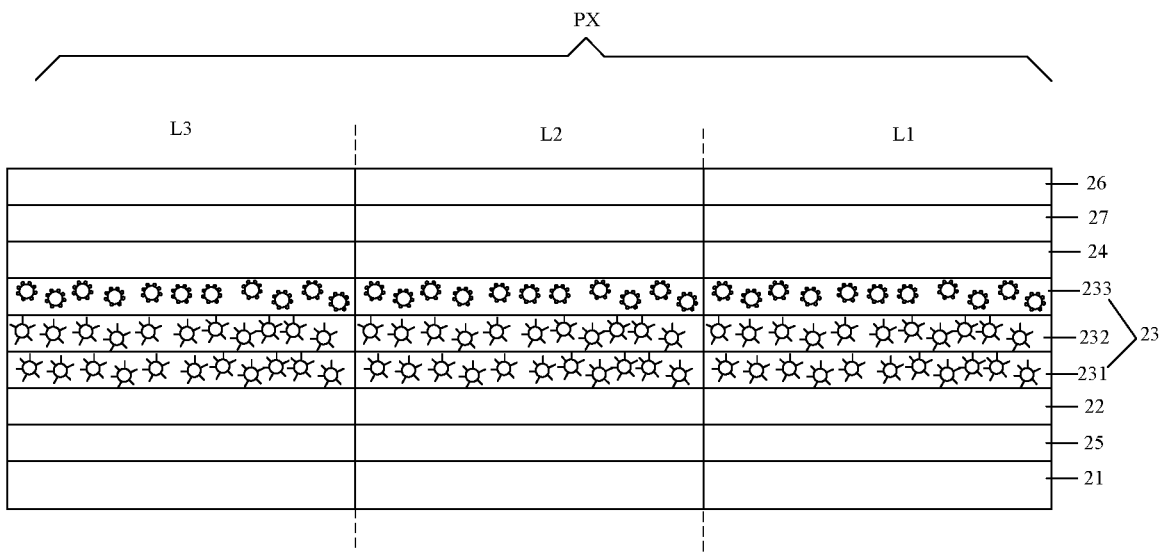
FIG. 5 is a schematic diagram of a structure of a display substrate according to an embodiment of the present disclosure.

An embodiment of the present disclosure further provides a display substrate. FIG. 5 is a schematic diagram of a structure of a display substrate according to an embodiment of the present disclosure. As shown in FIG. 5, the display substrate includes a plurality of pixel units PX, each pixel unit PX includes a plurality of light emitting devices L, and each light emitting device L employs the light emitting device provided in the above embodiments. The light emitting devices L include a same substrate 21, and anodes of the light emitting devices L are spaced from each other. FIG. 5 exemplarily shows that the first electrode 25 of each light emitting device L is an anode and the second electrode 26 of each light emitting device L is a cathode, but the embodiment of the present disclosure is not limited thereto.

In an embodiment of the present disclosure, light emitting colors of the plurality of light emitting devices L are different from each other in each pixel unit PX. Illustratively, as shown in FIG. 5, in each pixel unit PX, the plurality of light emitting devices L include a first light emitting device L1, a second light emitting device L2, and a third light emitting device L3; a light emitting color of the first light emitting device L1 is a first light emitting color, a light emitting color of the second light emitting device L2 is a second light emitting color, and a light emitting color of the third light emitting device L3 is a third light emitting color. Illustratively, the first light emitting color is red, the second light emitting color is green, and the third light emitting color is blue.

In an embodiment of the present disclosure, in each pixel unit PX, the modification conditions for the ligands of the quantum dot film layers in the light emitting layers 23 of the different light emitting devices L may be different, and may be specifically determined according to the balance condition of electrons and holes of the light emitting devices L.

An embodiment of the present disclosure further provides a display apparatus, which includes the above display substrate.

Illustratively, the display apparatus may be any product or component with a display function, such as electronic paper, a mobile phone, a tablet computer, a television, a monitor, a notebook computer, a digital photo frame, a navigator, or the like.

Figure 6:
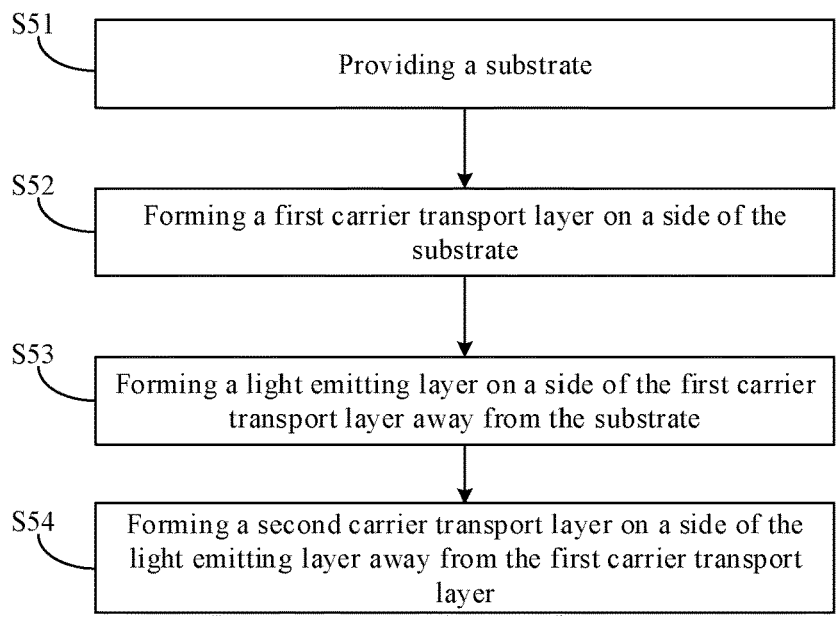
FIG. 6 is a flowchart of a method for manufacturing a light emitting device according to an embodiment of the present disclosure.

An embodiment of the present disclosure further provides a method for manufacturing a light emitting device. FIG. 6 is a flowchart of a method for manufacturing a light emitting device according to an embodiment of the present disclosure. As shown in FIG. 6, the light emitting device is the light emitting device provided by the above embodiment, and the method for manufacturing the light emitting device includes the following steps:

Step S51, providing a substrate.

The substrate may be a glass substrate.

Step S52, forming a first carrier transport layer on a side of the substrate.

The first carrier transport layer may be an electron transport layer or a hole transport layer.

Step S53, forming a light emitting layer on a side of the first carrier transport layer away from the substrate.

Step S54, forming a second carrier transport layer on a side of the light emitting layer away from the first carrier transport layer.

The light emitting layer includes at least two quantum dot film layers, and each quantum dot film layer contains quantum dots. The quantum dot film layer disposed close to the first carrier transport layer further contains carrier auxiliary ligands attached to the surface of the quantum dot body, and/or the quantum dot film layer disposed close to the second carrier transport layer further contains carrier auxiliary ligands attached to the surface of the quantum dot body.

In some embodiments, the carrier auxiliary ligand includes an inorganic ligand, such as chloride ions, which is formed on the surface of the quantum dot body in a following manner: a photo-acid generator and the initial organic ligands attached to the surface of the quantum dot body react under the illumination environment to generate inorganic ions (such as chloride ions), and the inorganic ions are formed on the surface of the quantum dot body in a ligand exchange mode.

In some embodiments, in a case where any quantum dot film layer of the quantum dot film layers has organic ligands attached to the surface of the quantum dot body, the quantum dot film layer is formed by: forming a quantum dot solution containing the initial organic ligands attached to the surface of the quantum dot body; causing the initial organic ligands attached to the surface of the quantum dot body to be subjected to a reaction, under the illumination environment, by improving solubility or through crosslinking, to form the quantum dot film layer.

In an embodiment of the present disclosure, the light emitting device may have an upright structure or an inverted structure. For example, in a case where the light emitting device has the upright structure, the first electrode is an anode, the second electrode is a cathode, the first carrier transport layer is a hole transport layer, and the second carrier transport layer is an electron transport layer. In a case where the light emitting device has the inverted structure, the first electrode is a cathode, the second electrode is an anode, the first carrier transport layer is an electron transport layer, and the second carrier transport layer is a hole transport layer. The light emitting device may further include a hole injection layer. In a case where the light emitting device has the upright structure, the hole injection layer is disposed between the first electrode and the first carrier transport layer. In a case where the light emitting device has the inverted structure, the hole injection layer is disposed between the second electrode and the second carrier transport layer.

Figure 7:
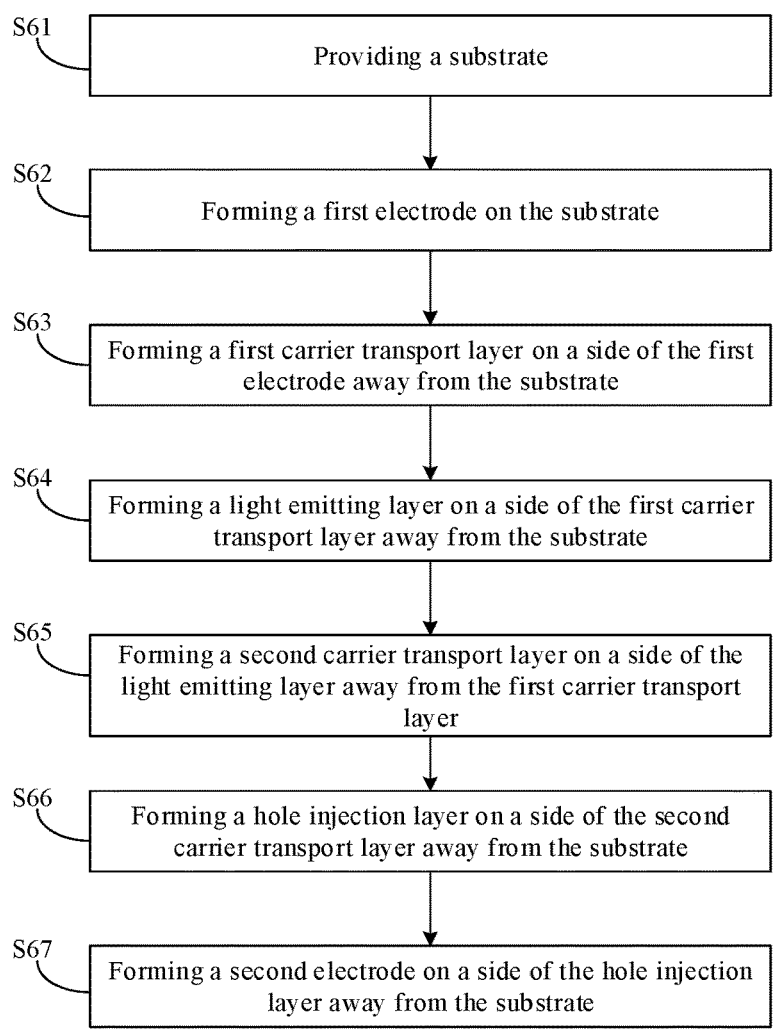
FIG. 7 is a flowchart of a method for manufacturing a light emitting device with an inverted structure in an embodiment of the present disclosure.
Figure 8A:
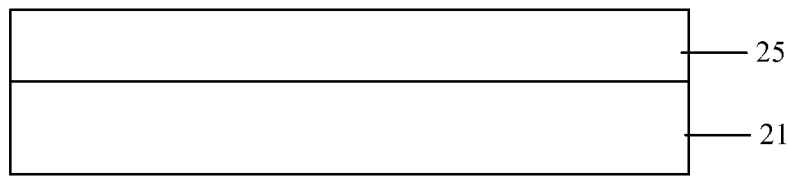
FIGS. 8a to 8h are schematic diagrams illustrating a manufacturing process of a light emitting device according to an embodiment of the present disclosure.
Figure 8B:
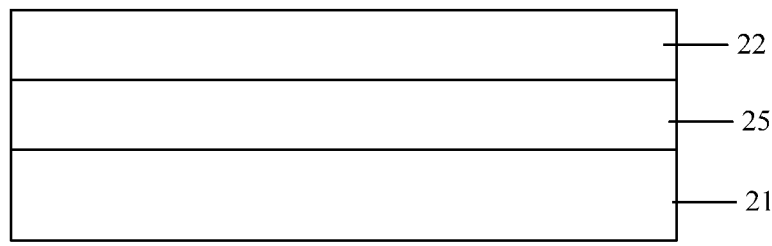
Figure 8C:
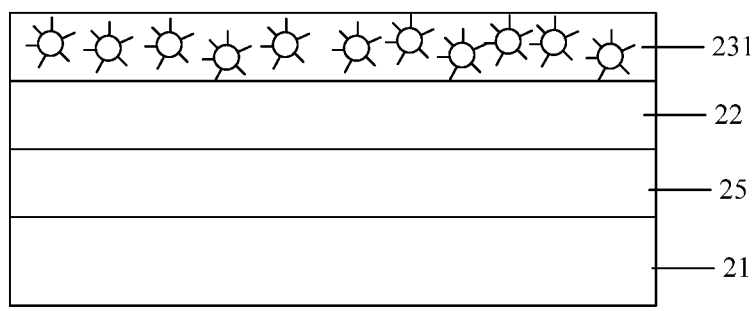
Figure 8D:
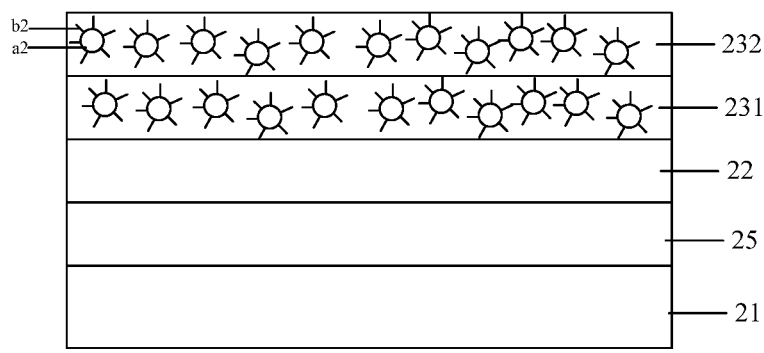
Figure 8E:
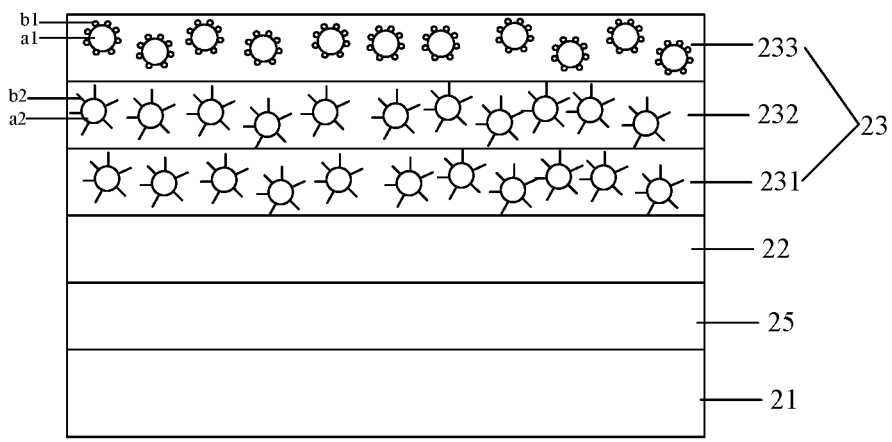
Figure 8F:
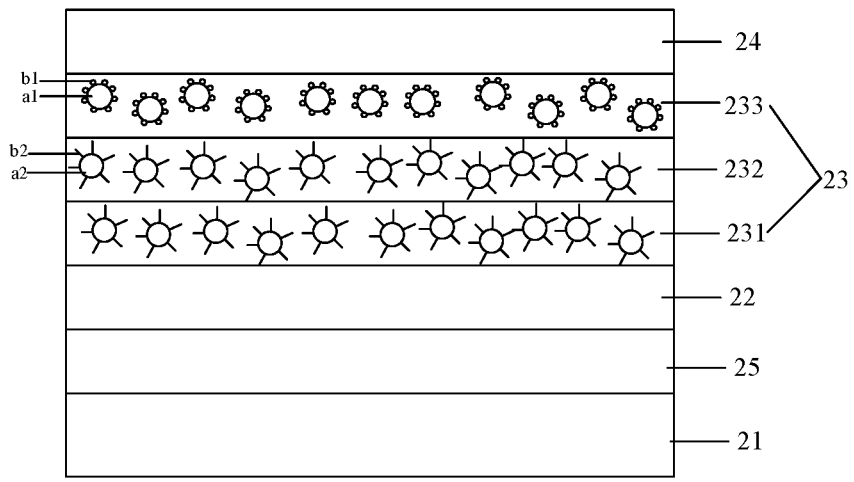
Figure 8G:
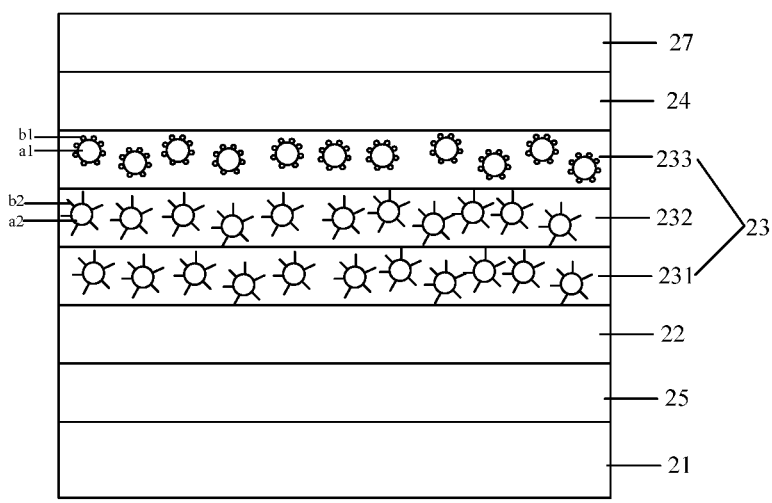
Figure 8H:
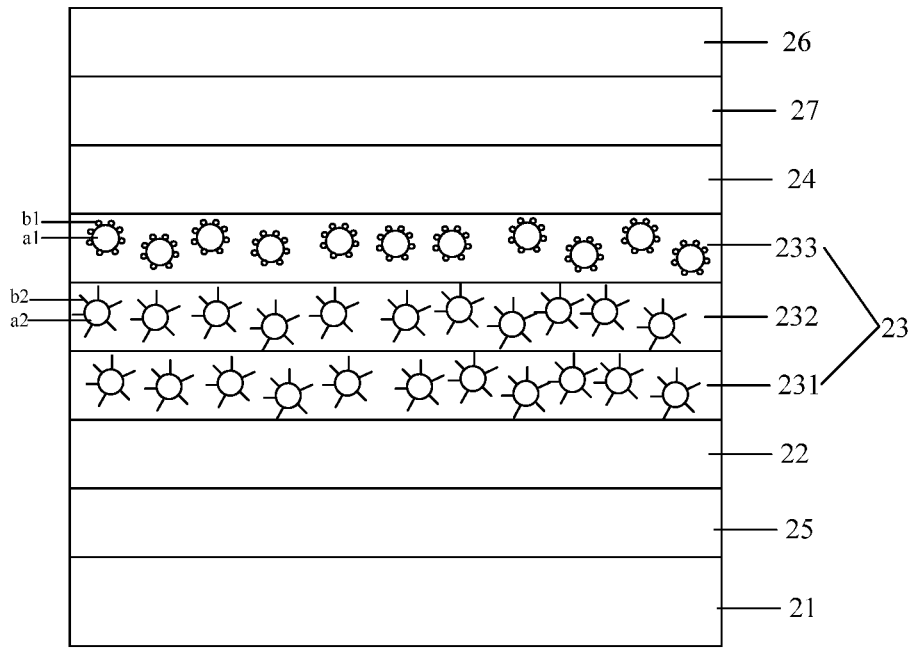

A method for manufacturing a light emitting device according to an embodiment of the present disclosure is described by taking a light emitting device with an inverted structure as an example. FIG. 7 is a flowchart of a method for manufacturing a light emitting device with an inverted structure in an embodiment of the present disclosure. FIGS. 8a to 8h are schematic diagrams illustrating a manufacturing process of a light emitting device according to an embodiment of the present disclosure. As shown in FIGS. 7 and 8a to 8h, the method for manufacturing a light emitting device with an inverted structure includes the following steps S61 to S67.

Step S61, providing a substrate 21.

Step S62, forming a first electrode 25 on the substrate 21.

The first electrode 25 may be a cathode. For example, in a case where the light emitting device is a bottom-emitting structure, the first electrode 25 may be made of a transparent metal material, such as indium tin oxide. In a case where the light emitting device is a top-emitting structure, the first electrode 25 may be made of a non-transparent metal material, such as copper. In this step, the first electrode 25 may be formed through a process such as evaporation or sputtering.

Step S63, forming a first carrier transport layer 22 on a side of the first electrode 25 away from the substrate 21.

The first carrier transport layer 22 is an electron transport layer. In this step, the electron transport layer includes a thin film of zinc oxide nanoparticle, and the step of forming the thin film of zinc oxide nanoparticle may specifically include: spin-coating a solution containing zinc oxide nanoparticles on the side of the first electrode 25 away from the substrate 21 through a sol-gel process in an air environment, to obtain the thin film of zinc oxide nanoparticle. Specifically, the solution containing zinc oxide nanoparticles is spin-coated on the side of the first electrode 25 away from the substrate 21, a concentration of the solution containing zinc oxide nanoparticles is 75 mg/ml, where spin-coating parameters may be set to include 2000 rpm (rotation speed) and 30$s$ (duration); and finally, after annealing, the first carrier transport layer 22 is obtained, where an annealing temperature may be set to be in a range of 60° C. to 180° C., for example, 180° C., and an annealing duration may be set to be in a range of 5 minutes to 15 minutes, for example, 10 minutes.

Step S64, forming a light emitting layer 23 on a side of the first carrier transport layer 22 away from the substrate 21.

In some embodiments, the light emitting layer 23 of the light emitting device having the inverted structure includes three quantum dot film layers, i.e., a first quantum dot film layer 231, a second quantum dot film layer 232, and a third quantum dot film layer 233. If the hole injection capability of the light emitting device having the inverted structure is insufficient, that is, if the number of holes reaching the light emitting layer in a unit time is less than the number of electrons reaching the light emitting layer in a unit time, a surface of a quantum dot body of the first quantum dot film layer 231 is attached with organic ligands, a surface of a quantum dot body of the second quantum dot film layer 232 is attached with organic ligands, a surface of a quantum dot body of the third quantum dot film layer 233 is attached with inorganic ligands, and the inorganic ligands are chloride ions (Cl⁻).

Figure 9:
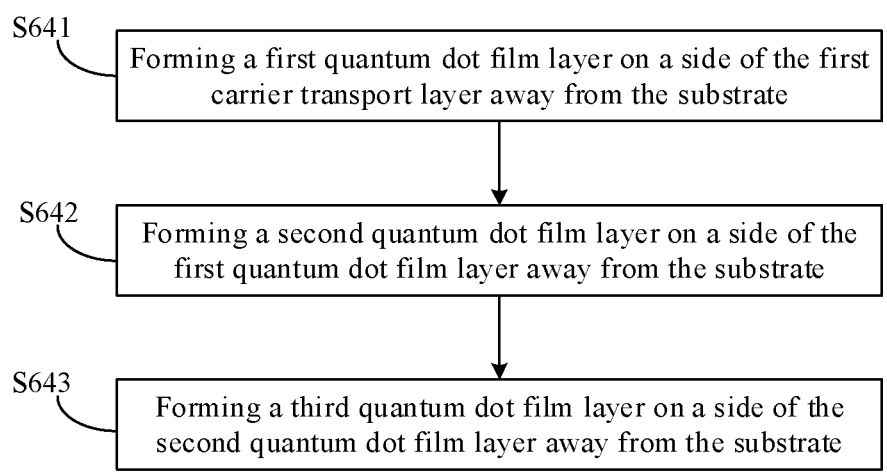
FIG. 9 is a flowchart of forming a light emitting layer 23 on a side of a first carrier transport layer 22 away from a substrate 21.
Figure 12A:
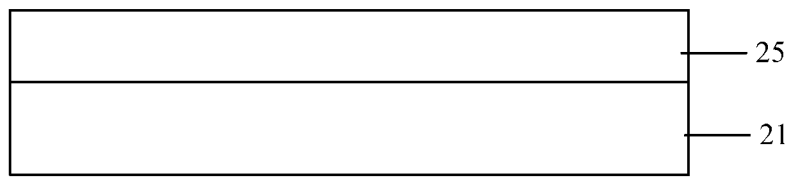
FIGS. 12a to 12h are schematic diagrams illustrating a manufacturing process of a light emitting device according to an embodiment of the present disclosure.
Figure 12B:
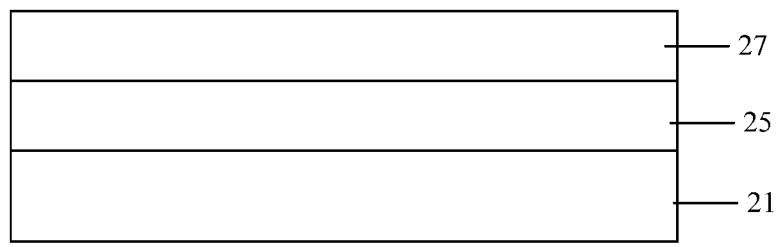
Figure 12C:
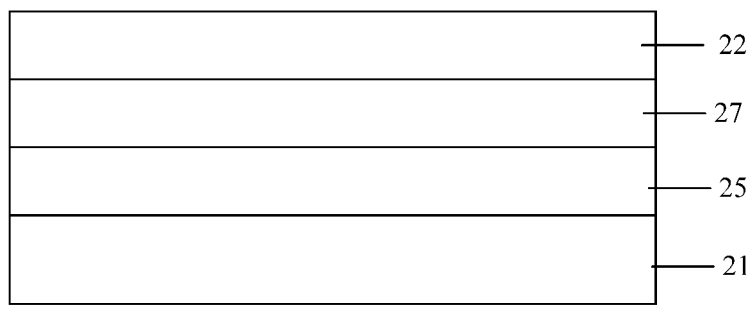
Figure 12D:
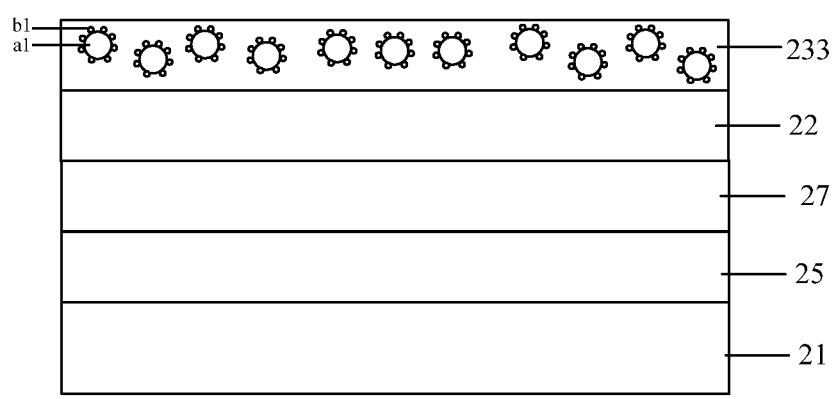
Figure 12E:
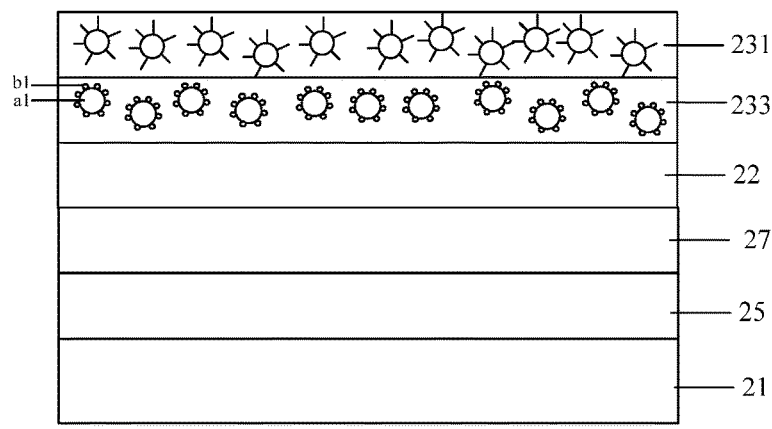
Figure 12F:
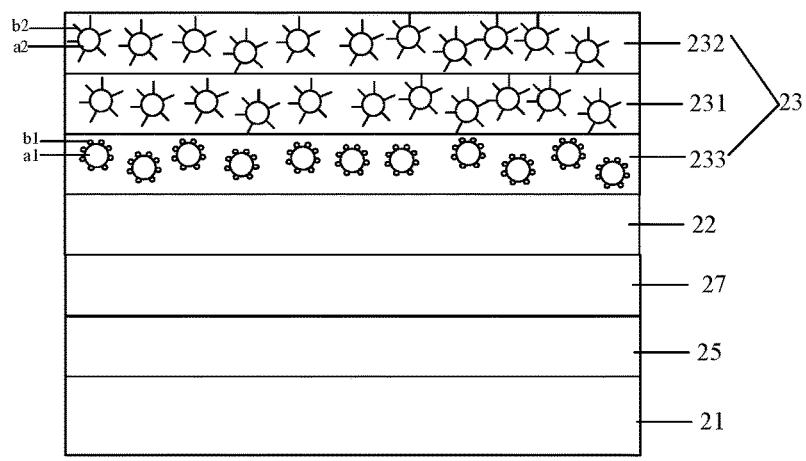
Figure 12G:
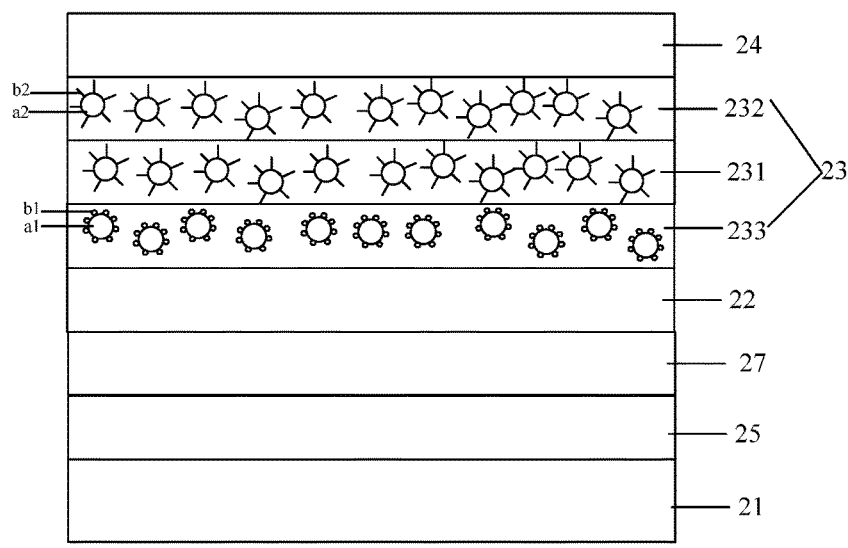
Figure 12H:
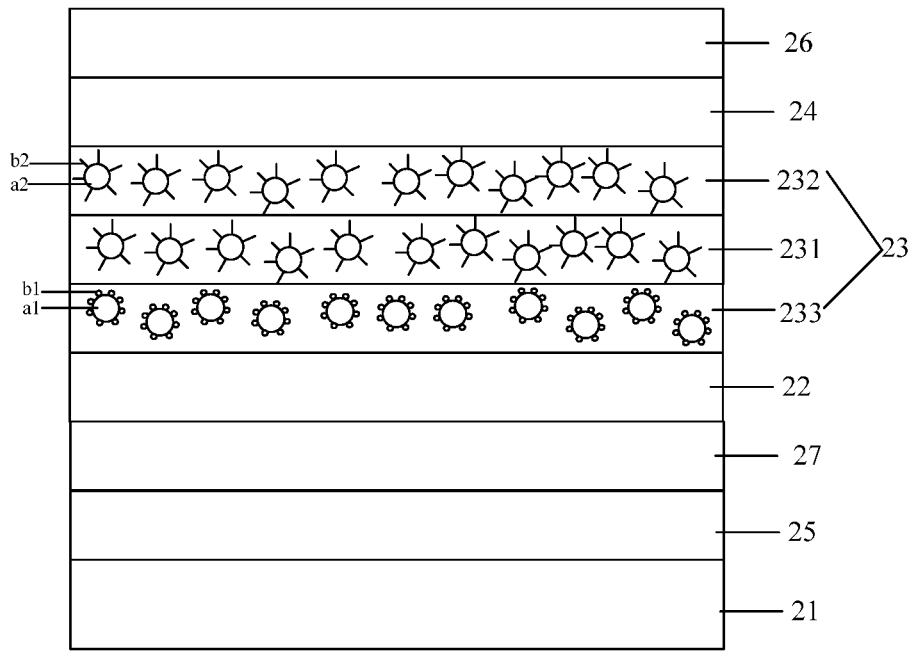

A process of forming the light emitting layer 23 in some embodiments will be described below in detail, by taking a case where the light emitting layer 23 includes three quantum dot film layers and the hole injection capability of the light emitting device having the upright structure is insufficient, as an example. FIG. 9 is a flowchart of forming a light emitting layer 23 on a side of a first carrier transport layer 22 away from a substrate 21. As shown in FIG. 9, the step of forming the light emitting layer 23 on the side of the first carrier transport layer 22 away from the substrate 21 includes steps S641 to S643.

Step S641, forming a first quantum dot film layer 231 on a side of the first carrier transport layer 22 away from the substrate 21.

In this embodiment, the quantum dot material of each quantum dot film layer has a core-shell structure of cadmium selenide or zinc sulfide, with an original ligand of oleic acid, and has a concentration of 20 mg/ml.

In this step, firstly, a first quantum dot solution is prepared. The step of preparing the first quantum dot solution may include: taking and drying 1 ml of octane solvent containing quantum dot materials; dissolving the solvent by using toluene, and adding 0.33 ml of second organic ligands into the solvent, and stirring the mixture at the room temperature for 4 hours, thereby realizing the ligand exchange of the quantum dots, namely, replacing the original ligands of the quantum dots with the second organic ligands; then, precipitating the quantum dots by using 8 ml of methanol, and discarding supernatant after centrifugation; dissolving the precipitated quantum dots by using 1 ml of the toluene; using 8 ml of methanol for precipitation, and discarding supernatant after centrifugation; performing a vacuum drying at 80° C., thereby obtaining the quantum dot powder; dissolving the quantum dot powder in the toluene again, to form the first quantum dot solution with a concentration of 5 mg/ml.

After the first quantum dot solution has been prepared, the first quantum dot solution with the second organic ligands is spin-coated on a side of the first carrier transport layer 22 away from the substrate 21 in an air environment. The spin-coating parameters may be set to include 3000 rpm (rotation speed) and 30 s (duration); and a photo-crosslinking initiator is added during the spin-coating, for example, 3% wt of benzoyl peroxide is used as the photo-crosslinking initiator.

After the spin-coating is completed, Ultraviolet (UV) exposure is performed on the first quantum dot solution. The exposure amount may be set to 300 mj. Under the exposure action, the photo-crosslinking initiator generates free radicals, which further initiate the terminal of the second organic ligand to crosslink, so that a cured quantum dot film layer is finally formed.

After the exposure is completed, the quantum dot film layer is developed by using chloroform and then is annealed; an annealing temperature may be set as 120° C., an annealing duration may be set as 20 minutes, finally forming a patterned first quantum dot film layer; and a surface of a quantum dot body of the first quantum dot film layer is attached with second organic ligands.

Step S642, forming a second quantum dot film layer 232 on a side of the first quantum dot film layer 231 away from the substrate 21.

In this embodiment, the quantum dot material of each quantum dot film layer has a core-shell structure of cadmium selenide or zinc sulfide, with an original ligand of oleic acid, and has a concentration of 20 mg/ml.

In this step, firstly, a second quantum dot solution is prepared. The step of preparing the second quantum dot solution may include: taking and drying 1 ml of octane solvent containing quantum dot materials; dissolving the solvent by using toluene, and adding 0.33 ml of third organic ligands into the solvent, and stirring the mixture at the room temperature for 4 hours, thereby realizing the ligand exchange of the quantum dots, namely, replacing the original ligands of the quantum dots with the third organic ligands; then, precipitating the quantum dots by using 8 ml of methanol, and discarding supernatant after centrifugation; dissolving the precipitated quantum dots by using 1 ml of the toluene; using 8 ml of methanol for precipitation, and discarding supernatant after centrifugation; performing a vacuum drying at 80° C., thereby obtaining the quantum dot powder; dissolving the quantum dot powder in the toluene again, to form the second quantum dot solution with a concentration of 5 mg/ml.

After the second quantum dot solution has been prepared, the second quantum dot solution with the third organic ligands is spin-coated on a side of the first quantum dot film layer 231 away from the substrate 21 in an air environment. The spin-coating parameters may be set to include 3000 rpm (rotation speed) and 30 s (duration); and a photo-crosslinking initiator is added during the spin-coating, for example, 2% wt of benzoyl peroxide is used as the photo-crosslinking initiator.

After the spin-coating is completed, Ultraviolet (UV) exposure is performed on the second quantum dot solution. The exposure amount may be set to 300 mj. Under the exposure action, the photo-crosslinking initiator generates free radicals, which further initiate the terminal of the third organic ligand to crosslink, so that a cured quantum dot film layer is finally formed.

After the exposure is completed, the quantum dot film layer is developed by using chloroform and then is annealed; an annealing temperature may be set as 120° C., an annealing duration may be set as 20 minutes, finally forming a patterned second quantum dot film layer; and a surface of a quantum dot body of the second quantum dot film layer is attached with third organic ligands.

Step S643, forming a third quantum dot film layer 233 on a side of the second quantum dot film layer 232 away from the substrate 21.

In this embodiment, the quantum dot material of each quantum dot film layer has a core-shell structure of cadmium selenide or zinc sulfide, with an original ligand of oleic acid, and has a concentration of 20 mg/ml.

In this step, firstly, a third quantum dot solution is prepared. The step of preparing the third quantum dot solution may include: taking and drying 1 ml of octane solvent containing quantum dot materials; dissolving the solvent by using chloroform, and adding 0.33 ml of first organic ligands into the solvent, and stirring the mixture at the room temperature for 4 hours, thereby realizing the ligand exchange of the quantum dots, namely, replacing the original ligands of the quantum dots with the first organic ligands; then, precipitating the quantum dots by using 8 ml of methanol, and discarding supernatant after centrifugation; dissolving the precipitated quantum dots by using 1 ml of the chloroform; using 8 ml of methanol for precipitation, and discarding supernatant after centrifugation; performing a vacuum drying at 80° C., thereby obtaining the quantum dot powder; dissolving the quantum dot powder in the toluene again, to form the third quantum dot solution with a concentration of 5 mg/ml.

After the third quantum dot solution has been prepared, the third quantum dot solution with the first organic ligands is spin-coated on a side of the second quantum dot film layer 231 away from the substrate 21 in an air environment. The spin-coating parameters may be set to include 3000 rpm (rotation speed) and 30 s (duration); and a photo-acid generator is added during the spin-coating, for example, 5% wt of 2,4-bis(trichloromethyl)-6-4-Methoxystyrene-S-triazine is used as the photo-acid generator.

After the spin-coating is completed, Ultraviolet (UV) exposure is performed on the third quantum dot solution. The exposure amount may be set to 150 mj, and a wavelength of the UV may be set to be 365 nm. FIG. 10 is a schematic diagram illustrating that a photo-acid generator generates chloride ions under illumination and the chloride ions react with quantum dots to realize ligand exchange. As shown in FIG. 10, the structural formula of the photo-acid generator is:

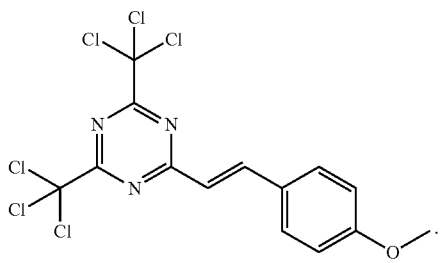 [SMILES: COc1ccc(/C=C/c2nc(C(Cl)(Cl)Cl)nc(C(Cl)(Cl)Cl)n2)cc1]

Under the exposure action, the photo-acid generator is decomposed into

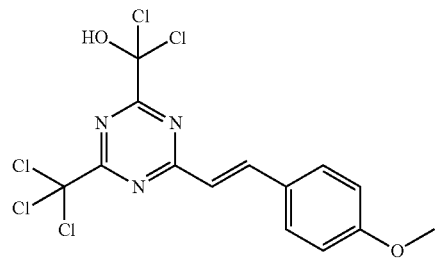 [SMILES: COc1ccc(/C=C/c2nc(C(O)(Cl)Cl)nc(C(Cl)(Cl)Cl)n2)cc1]

and HCl. The HCl contains chloride ions Cl⁻, the chloride ions Cl⁻ in the HCl and the quantum dots of the third quantum dot solution are subjected to chemical reaction, so that ligands are replaced on the surface of each quantum dot body of the third quantum dot solution, namely, the first organic ligands are replaced by the chloride ions (i.e., inorganic ligands), and finally, the quantum dot film layer with the chloride ions as the inorganic ligands is formed by curing.

After the exposure is completed, the quantum dot film layer is developed by using chloroform and then is annealed; the annealing temperature may be set as 120° C., the annealing duration may be set as 20 minutes, finally forming a patterned third quantum dot film layer; and a surface of a quantum dot body of the third quantum dot film layer is attached with the chloride ions (i.e., inorganic ligands).

Step S65, forming a second carrier transport layer 24 on a side of the light emitting layer 23 away from the substrate 21.

The second carrier transport layer 24 may be a hole transport layer. The material of the hole transport layer may include poly(9,9-dioctylfluorene-co-N-(4-butylphenyl)diphenylamine) (TFB), or polyvinylcarbazole (PVK). In this step, a hole transport material may be formed on the light emitting layer 23 through a process such as spin-coating or evaporation, and then be cured to obtain the hole transport layer.

S66, forming a hole injection layer 27 on a side of the second carrier transport layer 24 away from the substrate 21.

The material of the hole injection layer 27 may include poly(3,4-ethylenedioxythiophene)-polystyrene sulfonic acid (PEDOT/PSS). In this step, a hole injection material may be formed on the second carrier transport layer 24 through a process such as spin-coating or evaporation, and then be cured to obtain the hole injection layer 27.

S67, forming a second electrode 26 on a side of the hole injection layer 27 away from the substrate 21.

The second electrode 26 may be an anode. In this step, the second electrode 26 may be formed on a side of the hole injection layer 27 away from the substrate 21 through a process such as evaporation or sputtering, and the material of the second electrode 26 may include a metal such as aluminum, copper, or silver, or may include an indium tin oxide thin film or indium zinc oxide. A thickness of the second electrode 26 may be 120 nm.

In the embodiment of the manufacturing method, specific descriptions and definitions of the first organic ligands, the second organic ligands and the third organic ligands may be referred to the descriptions related to the embodiment of the light emitting device, and details are not repeated here.

A method for manufacturing a light emitting device according to an embodiment of the present disclosure is described by taking a light emitting device with an upright structure as an example. FIG. 11 is a flowchart of a method for manufacturing a light emitting device with an upright structure in an embodiment of the present disclosure. FIGS. 12a to 12h are schematic diagrams illustrating a manufacturing process of a light emitting device according to an embodiment of the present disclosure. As shown in FIGS. 11 and 12a to 12h, the method for manufacturing a light emitting device with an inverted structure includes the following steps S71 to S77.

Step S71, providing a substrate 21.

Step S72, forming a first electrode 25 on the substrate 21.

The first electrode 25 may be an anode. For example, in a case where the light emitting device has a bottom-emitting structure, the first electrode 25 may be made of a transparent metal material, such as indium tin oxide; in a case where the light emitting device has a top-emitting structure, the first electrode 25 may be made of a non-transparent metal material, such as copper. In this step, the first electrode 25 may be formed through a process such as evaporation or sputtering.

In some embodiments, the first electrode 25 may alternatively have a multi-layer electrode structure, i.e. composed of a plurality of layers of electrodes. For example, the first electrode 25 includes a three-layer electrode structure, i.e., a first sub-electrode, a second sub-electrode and a third sub-electrode sequentially stacked. The first sub-electrode may be made of a transparent metal material, such as indium tin oxide; the second sub-electrode may be made of a metal material, such as silver; the third sub-electrode may be made of a transparent metal material, such as indium tin oxide.

Step S73, forming a hole injection layer 27 on a side of the first electrode 25 away from the substrate 21.

The material of the hole injection i layer 27 may include poly(3,4-ethylenedioxythiophene)-polystyrene sulfonic acid (PEDOT/PSS). In this step, a hole injection material may be formed on the second carrier transport layer 24 through a process such as spin-coating or evaporation, and then be cured to obtain the hole injection layer 27.

Step S74, forming a first carrier transport layer 22 on a side of the hole injection layer 27 away from the substrate 21.

The first carrier transport layer 22 may be a hole transport layer, the material of the hole transport layer may include a thin film of nickel oxide nanoparticle, and the step of forming the thin film of nickel oxide nanoparticle may specifically include: spin-coating a solution containing nickel oxide nanoparticles on the side of the hole injection layer 27 away from the substrate 21 by using a sol-gel method under a nitrogen environment to obtain the thin film of nickel oxide nanoparticle. Specifically, the solution containing the nickel oxide nanoparticles is spin-coated on the side of the hole injection layer 27 away from the substrate 21, a concentration of the solution containing the nickel oxide nanoparticles is 25 mg/ml or 30 mg/ml, where the spin-coating parameters may be set to include 2000 rpm or 4000 rpm (rotation speed) and 30 s (duration); and finally, after annealing, the first carrier transport layer 22 is obtained, where an annealing temperature may be set to be in a range of 60° C. to 180° C., for example, 120° C., and an annealing duration may be set to be in a range of 5 minutes to 30 minutes, for example, 20 minutes.

Step S75, forming a light emitting layer 23 on a side of the first carrier transport layer 22 away from the substrate 21.

In some embodiments, the light emitting layer 23 of the light emitting device with the upright structure includes three quantum dot film layers, namely a third quantum dot film layer 233, a first quantum dot film layer 231, and a second quantum dot film layer 232. If the hole injection capability of the light emitting device with the upright structure is insufficient, that is, if the number of holes reaching the light emitting layer in a unit time is less than the number of electrons reaching the light emitting layer in a unit time, a surface of a quantum dot body of the third quantum dot film layer is attached with inorganic ligands, which are chloride ions (Cl—); and a surface of a quantum dot body of each of the first quantum dot film layer and the second quantum dot film layer is attached with organic ligands.

Figure 13:
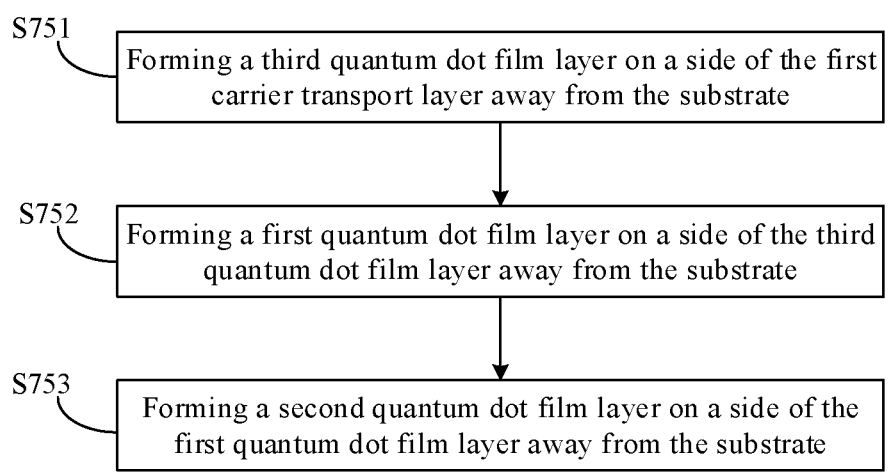
FIG. 13 is another flowchart of forming a light emitting layer 23 on a side of a first carrier transport layer 22 away from a substrate 21.

The process of forming the light emitting layer 23 in some embodiments will be described in detail by taking a case where the light emitting layer 23 includes three quantum dot film layers and the hole injection capability of the light emitting device with the upright structure is insufficient, as an example. FIG. 13 is another flowchart of forming a light emitting layer 23 on a side of a first carrier transport layer 22 away from a substrate 21. As shown in FIG. 13, the step of forming the light emitting layer 23 on the side of the first carrier transport layer 22 away from the substrate 21 includes steps S751 to S753.

Step S751, forming a third quantum dot film layer 233 on a side of the first carrier transport layer 22 away from the substrate 21.

For the description of step S751, reference may be made to the description of step S643 mentioned above, and details are not repeated here.

Step S752, forming a first quantum dot film layer 231 on a side of the third quantum dot film layer 233 away from the substrate 21.

For the description of step S752, reference may be made to the description of step S641 above, and details are not repeated here.

Step S753, forming a second quantum dot film layer 232 on a side of the first quantum dot film layer 231 away from the substrate 21.

For the description of step S753, reference may be made to the description of step S642, and details are not repeated here.

In some embodiments, the light emitting layer 23 of the light emitting device with the upright structure includes three quantum dot film layers, i.e., a fourth quantum dot film layer 234, a fifth quantum dot film layer 235 and a sixth quantum dot film layer 236. If the hole injection capability and the electron injection capability of the light emitting device with the upright structure are balanced, that is, if the number of holes reaching the light emitting layer in a unit time is equivalent to the number of electrons reaching the light emitting layer in a unit time, a surface of a quantum dot body of each of the fourth quantum dot film layer 234, the fifth quantum dot film layer 235 and the sixth quantum dot film layer 236 is attached with organic ligands (such as the third organic ligands as above).

Figure 14:
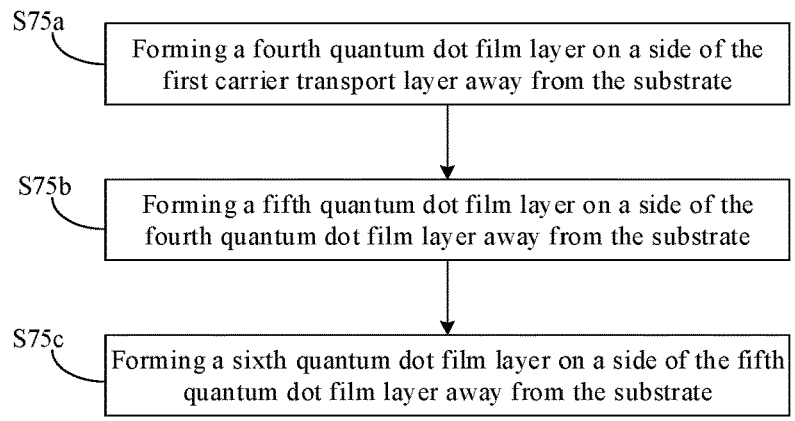
FIG. 14 is still another flowchart of forming a light emitting layer 23 on a side of a first carrier transport layer 22 away from a substrate 21.

The process of forming the light emitting layer 23 in some embodiments will be described in detail by taking a case where the light emitting layer 23 includes three quantum dot film layers and the hole injection capability and the electron injection capability of the light emitting device with the upright structure are balanced, as an example. FIG. 14 is still another flowchart of forming a light emitting layer 23 on a side of a first carrier transport layer 22 away from a substrate 21. As shown in FIG. 14, the step of forming the light emitting layer 23 on the side of the first carrier transport layer 22 away from the substrate 21 includes steps S75a to S75c.

Step S75a, forming a fourth quantum dot film layer on a side of the first carrier transport layer away from the substrate.

In this embodiment, the quantum dot material of each quantum dot film layer has a core-shell structure of cadmium selenide or zinc sulfide, with an original ligand of oleic acid, and has a concentration of 20 mg/ml.

In this step, firstly, a fourth quantum dot solution is prepared. The step of preparing the fourth quantum dot solution may include: taking and drying 1 ml of octane solvent containing quantum dot materials; dissolving the solvent by using toluene, and adding 0.33 ml of third organic ligands into the solvent, and stirring the mixture at the room temperature for 4 hours, thereby realizing the ligand exchange of the quantum dots, namely, replacing the original ligands of the quantum dots with the third organic ligands; then, precipitating the quantum dots by using 8 ml of methanol, and discarding supernatant after centrifugation; dissolving the precipitated quantum dots by using 1 ml of the toluene; using 8 ml of methanol for precipitation, and discarding supernatant after centrifugation; performing a vacuum drying at 80° C., thereby obtaining the quantum dot powder; dissolving the quantum dot powder in the toluene again, to form the fourth quantum dot solution with a concentration of 5 mg/ml.

After the fourth quantum dot solution has been prepared, the fourth quantum dot solution with the third organic ligands is spin-coated on the side of the first carrier transport layer 22 away from the substrate 21 in an air environment.

The spin-coating parameters may be set to include 3000 rpm (rotation speed) and 30 s (duration); and a photo-acid generator is added during the spin-coating, for example, 5% wt of 2,4-bis(trichloromethyl)-6-4-Methoxystyrene-S-triazine is used as the photo-acid generator.

After the spin-coating is completed, Ultraviolet (UV) exposure is performed on the fourth quantum dot solution. The exposure amount may be set to 150 mj. Finally, a cured quantum dot film layer is formed.

After the exposure is completed, the quantum dot film layer is developed by using chloroform and then is annealed; an annealing temperature may be set as 120° C., an annealing duration may be set as 20 minutes, finally forming a patterned fourth quantum dot film layer; and a surface of a quantum dot body of the fourth quantum dot film layer is attached with the third organic ligands.

Step S75b, forming a fifth quantum dot film layer on a side of the fourth quantum dot film layer away from the substrate.

In this step, firstly, a fifth quantum dot solution is prepared, and the fifth quantum dot solution is the same as the fourth quantum dot solution, which is not described herein again.

After the fifth quantum dot solution has been prepared, the fifth quantum dot solution with the third organic ligands is spin-coated on the side of the fourth quantum dot film layer away from the substrate in an air environment. The spin-coating parameters may be set to include 3000 rpm (rotation speed) and 30 s (duration); and a photo-acid generator is added during the spin-coating, for example, 3% wt of 2,4-bis(trichloromethyl)-6-4-Methoxystyrene-S-triazine is used as the photo-acid generator.

After the spin-coating is completed, Ultraviolet (UV) exposure is performed on the fifth quantum dot solution. The exposure amount may be set to 300 mj. Finally, a cured quantum dot film layer is formed.

After the exposure is completed, the quantum dot film layer is developed by using chloroform and then is annealed; an annealing temperature may be set as 120° C., an annealing duration may be set as 20 minutes, finally forming a patterned fifth quantum dot film layer; and a surface of a quantum dot body of the fifth quantum dot film layer is attached with the third organic ligands.

Step S75c, forming a sixth quantum dot film layer on a side of the fifth quantum dot film layer away from the substrate.

In this step, firstly, a sixth quantum dot solution is prepared, and the sixth quantum dot solution is the same as the fourth quantum dot solution, which is not described herein again.

After the sixth quantum dot solution has been prepared, the sixth quantum dot solution with the third organic ligands is spin-coated on the side of the fifth quantum dot film layer away from the substrate in an air environment. The spin-coating parameters may be set to include 3000 rpm (rotation speed) and 30 s (duration); and a photo-acid generator is added during the spin-coating, for example, 2% wt of 2,4-bis(trichloromethyl)-6-4-Methoxystyrene-S-triazine is used as the photo-acid generator.

After the spin-coating is completed, Ultraviolet (UV) exposure is performed on the sixth quantum dot solution. The exposure amount may be set to 300 mj. Finally, a cured quantum dot film layer is formed.

After the exposure is completed, the quantum dot film layer is developed by using chloroform and then is annealed; an annealing temperature may be set as 120° C., an annealing duration may be set as 20 minutes, finally forming a patterned sixth quantum dot film layer; and a surface of a quantum dot body of the sixth quantum dot film layer is attached with the third organic ligands.

Step S76, forming a second carrier transport layer 24 on a side of the light emitting layer 23 away from the substrate 21.

The second carrier transport layer 24 may be an electron transport layer. In this step, the electron transport layer includes a thin film of zinc oxide nanoparticle, and the step of forming the thin film of zinc oxide nanoparticle may specifically include: spin-coating a solution containing zinc oxide nanoparticles on the side of the light emitting layer 23 away from the substrate 21 through a sol-gel process in an air environment, to obtain the thin film of zinc oxide nanoparticle. Specifically, the solution containing zinc oxide nanoparticles is spin-coated on the side of the light emitting layer 23 away from the substrate 21, a concentration of the solution containing zinc oxide nanoparticles is 30 mg/ml, where spin-coating parameters may be set to include 3000 rpm (rotation speed) and 30 s (duration); and finally, after annealing, the second carrier transport layer 24 is obtained, where an annealing temperature may be set to be in a range of 60° C. to 180° C., for example, 120° C., and an annealing duration may be set to be in a range of 5 minutes to 30 minutes, for example, 30 minutes.

S77, forming a second electrode 26 on a side of the second carrier transport layer 24 away from the substrate 21.

The second electrode 26 may be a cathode. In this step, the second electrode 26 may be formed on the side of the second carrier transport layer 24 away from the substrate 21 by evaporation or sputtering; and a material of the second electrode 26 may include a metal such as aluminum, copper, or silver, or may include an indium tin oxide thin film, an indium zinc oxide, an indium gallium zinc oxide (IGZO), or the like. A thickness of the second electrode 26 may be 120 nm or 50 nm.

An embodiment of the present disclosure further provides a method for manufacturing a display substrate, and the display substrate includes the display substrate provided by the above embodiment.

A method for manufacturing a display substrate according to an embodiment of the present disclosure will be described below in detail, by taking a case where each pixel unit of the display substrate includes three light emitting devices, and light emitting colors of the three light emitting devices are a first light emitting color, a second light emitting color, and a third light emitting color, respectively, as an example.

Figure 15:
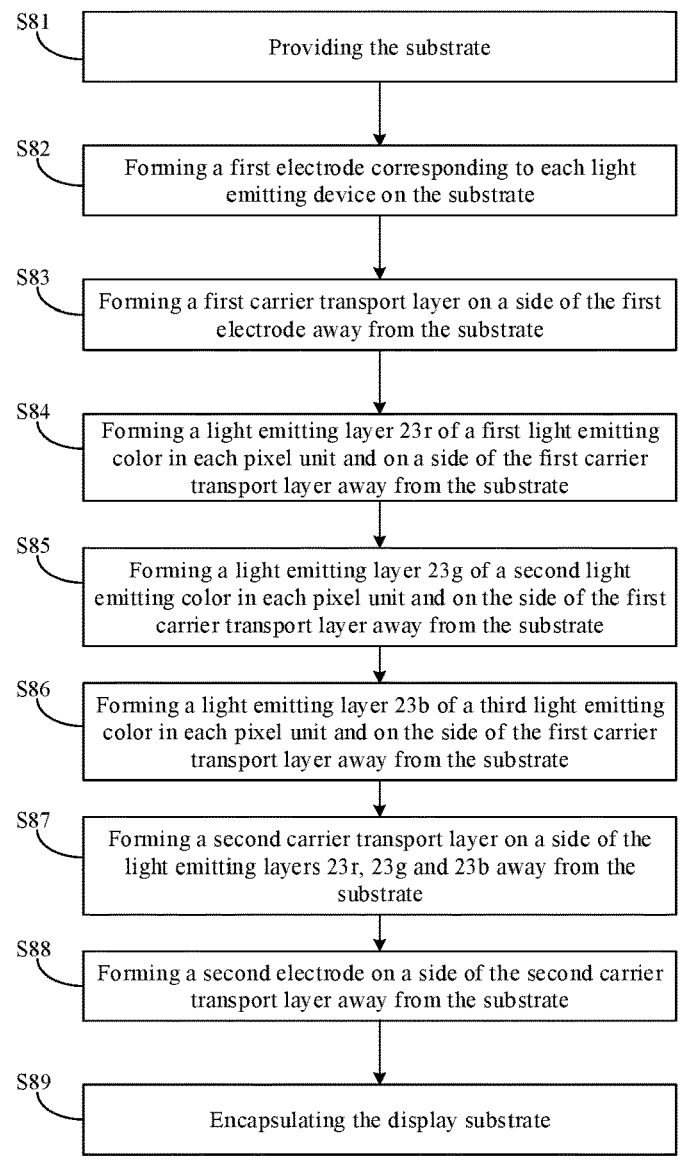
FIG. 15 is a flowchart of a method for manufacturing a display substrate according to an embodiment of the present disclosure.
Figure 16A:
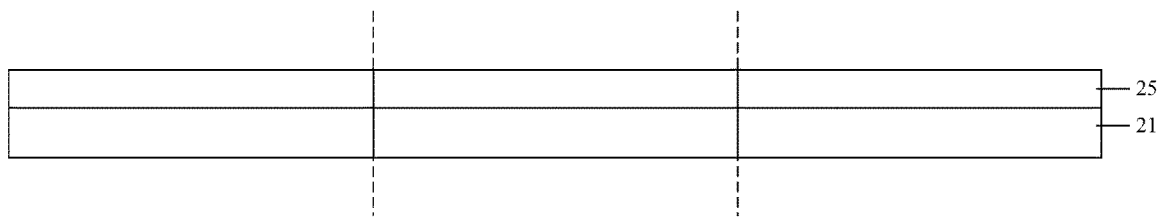
FIGS. 16a to 16h are schematic diagrams illustrating a manufacturing process of a display substrate according to an embodiment of the present disclosure.
Figure 16B:
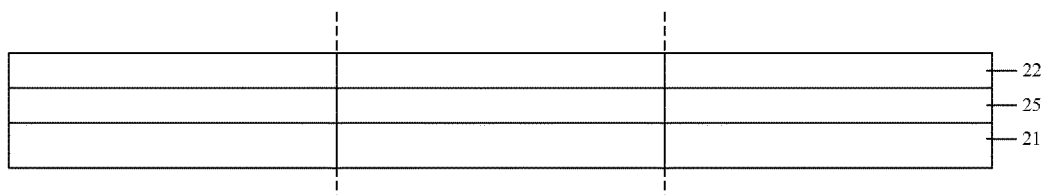
Figure 16C:
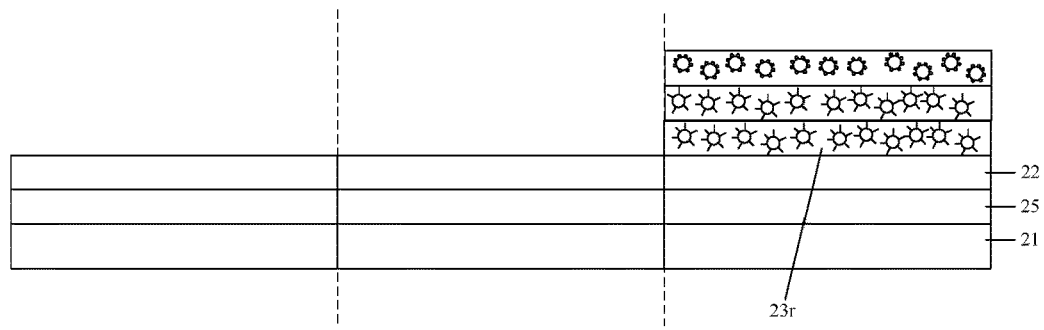
Figure 16D:
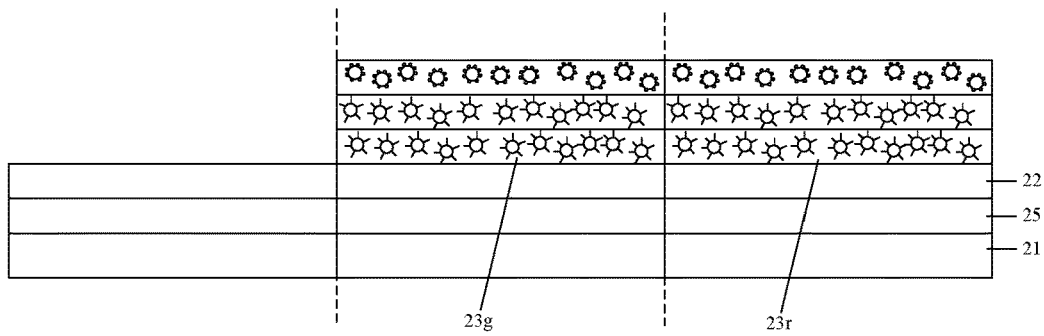
Figure 16E:
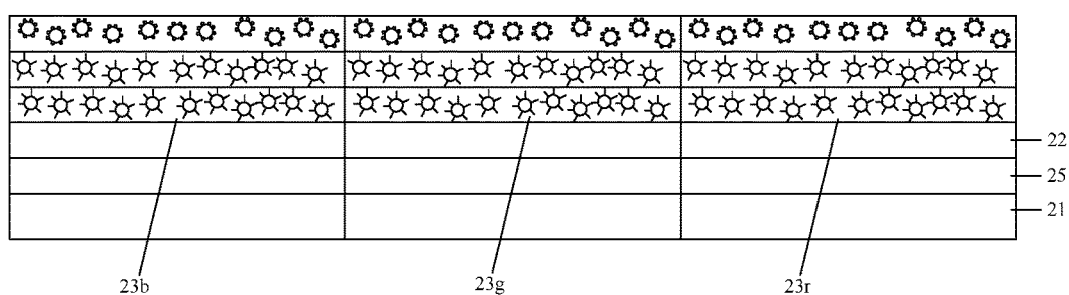
Figure 16F:
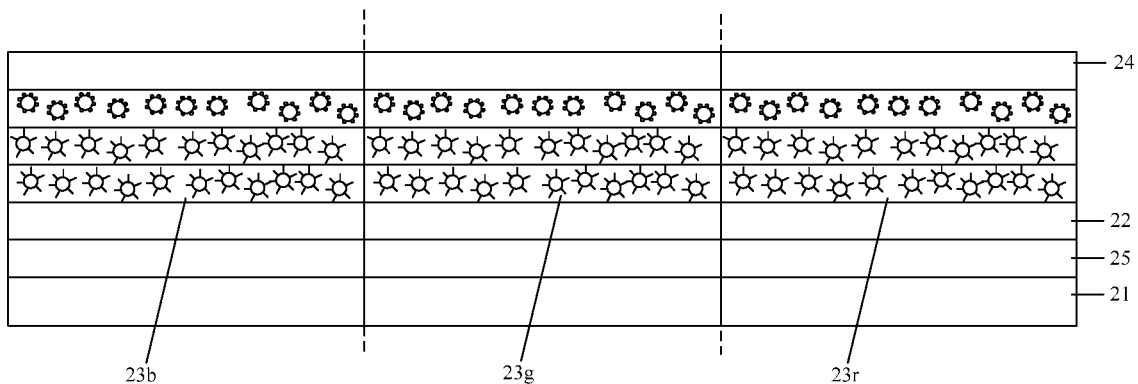
Figure 16G:
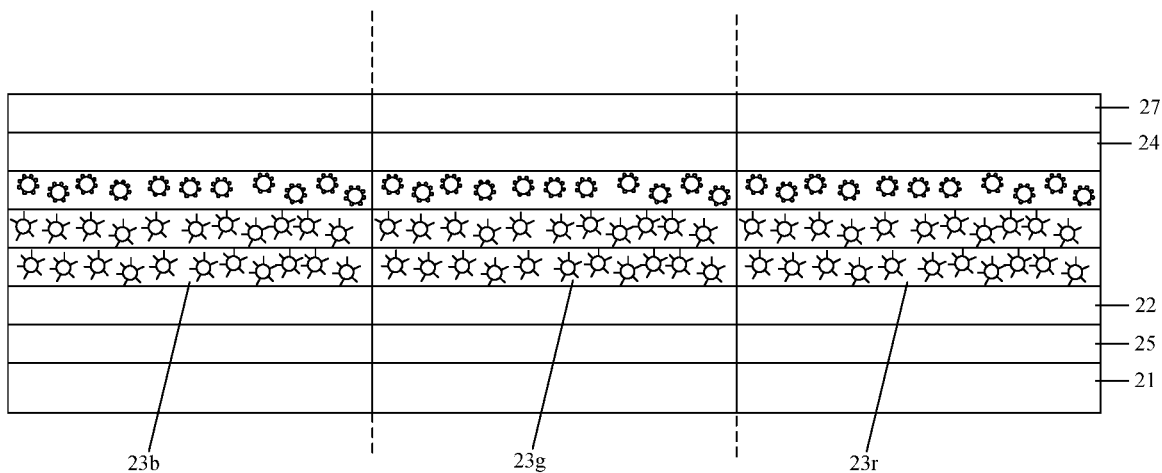
Figure 16H:
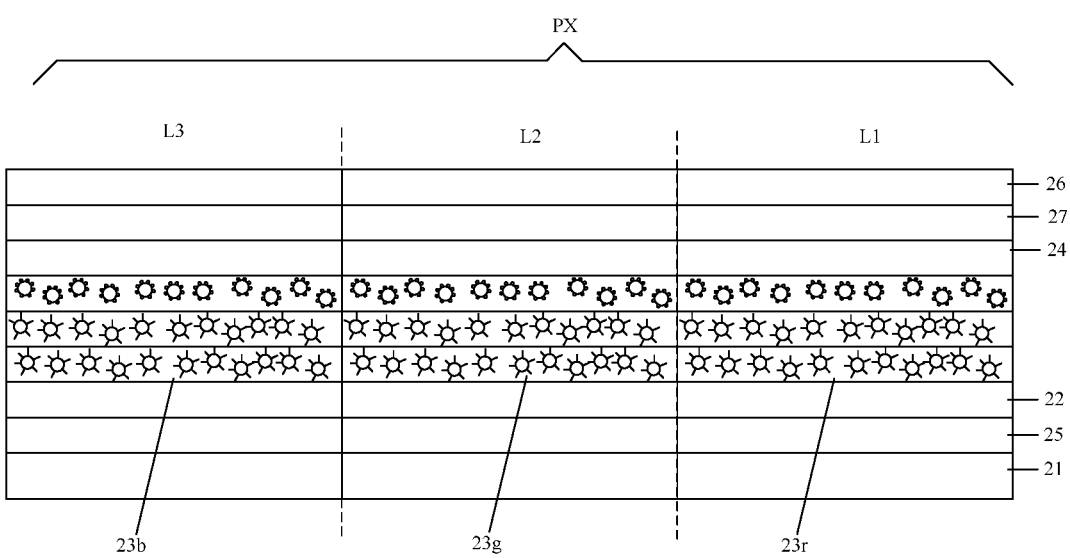

FIG. 15 is a flowchart of a method for manufacturing a display substrate according to an embodiment of the present disclosure. FIGS. 16a to 16h are schematic diagrams illustrating a manufacturing process of a display substrate according to an embodiment of the present disclosure. As shown in FIGS. 15 and 16a to 16h, the method for manufacturing a display substrate according to an embodiment of the present disclosure includes the following steps:

Step S81, providing the substrate 21.

Step S82, forming a first electrode 25 corresponding to each light emitting device on the substrate 21.

Step S83, forming a first carrier transport layer 22 on a side of the first electrode 25 away from the substrate 21.

Step S84, forming a light emitting layer 23r of a first light emitting color in each pixel unit and on a side of the first carrier transport layer 22 away from the substrate 21.

The first light emitting color is red. For the manufacturing method of the light emitting layer 23r, reference may be made to the manufacturing method of the light emitting layer provided in the above embodiments, and details are not repeated here.

Step S85, forming a light emitting layer 23g of a second light emitting color in each pixel unit and on the side of the first carrier transport layer 22 away from the substrate 21.

The second light emitting color is green. For the manufacturing method of the light emitting layer 23g, reference may be made to the manufacturing method of the light emitting layer provided in the above embodiments, and details are not repeated here.

Step S86, forming a light emitting layer 23b of a third light emitting color in each pixel unit and on the side of the first carrier transport layer 22 away from the substrate 21.

The third light emitting color is blue. For the manufacturing method of the light emitting layer 23b, reference may be made to the manufacturing method of the light emitting layer provided in the above embodiments, and details are not repeated here.

Step S87, forming a second carrier transport layer 24 on a side of the light emitting layers 23r, 23g and 23b away from the substrate 21.

Step S88, forming a second electrode 26 on a side of the second carrier transport layer 24 away from the substrate 21.

In some embodiments, each light emitting device further includes a hole injection layer 27. In some embodiments, the hole injection layer 27 is formed between the first electrode 25 and the first carrier transport layer 22. In some embodiments, the hole injection layer 27 is formed between the second carrier transport layer 24 and the second electrode 26.

Step S89, encapsulating the display substrate. For example, the display substrate is encapsulated using an encapsulation cover plate.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A light emitting device, comprising a first carrier transport layer, a light emitting layer and a second carrier transport layer sequentially stacked on a substrate, wherein the light emitting layer comprises at least two quantum dot film layers, and each of the at least two quantum dot film layers comprises quantum dots;

wherein the quantum dot film layer of the at least two quantum dot film layers close to the first carrier transport layer further comprises carrier auxiliary ligands, each of which is configured to be attached to a surface of a body of the quantum dot, and/or the quantum dot film layer of the at least two quantum dot film layers close to the second carrier transport layer further comprises carrier auxiliary ligands, each of which is configured to be attached to a surface of a body of the quantum dot, wherein each of the at least two quantum dot film layers is formed by initial organic ligands, attached to surfaces of bodies of the quantum dots, subjected to a reaction.

2. The light emitting device of claim 1, wherein a thickness of each of at least one quantum dot film layer in the at least two quantum dot film layers is less than a thickness of the first carrier transport layer; and/or a thickness of each of at least one quantum dot film layer in the at least two quantum dot film layers is less than a thickness of the second carrier transport layer.

3. The light emitting device of claim 1, wherein bodies of the quantum dots of the at least two quantum dot film layers are all made of a same material, and at least two quantum dot film layers comprise ligands made of different materials.

4. The light emitting device of claim 1, wherein the carrier auxiliary ligands in either the quantum dot film layer close to the first carrier transport layer or the quantum dot film layer close to the second carrier transport layer comprises an inorganic ligand or an organic ligand.

5. The light emitting device of claim 4, wherein the organic ligand comprises a second organic ligand; and

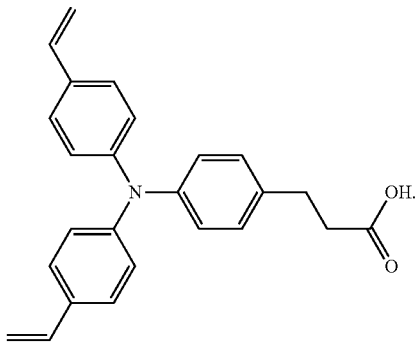 [SMILES: C=Cc1ccc(N(c2ccc(C=C)cc2)c2ccc(CCC(=O)O)cc2)cc1]

a structural formula of the second organic ligand is.

6. The light emitting device of claim 4, wherein the inorganic ligand comprises a halogen element or a chalcogen element.

7. The light emitting device of claim 6, wherein a chemical formula of the inorganic ligand comprises $K^-$;

wherein K is a halogen element.

8. The light emitting device of claim 6, wherein a chemical formula of the inorganic ligand comprises $ABx^{y-}$;

wherein B is a chalcogen element, and both of x and y are positive integers.

9. The light emitting device of claim 8, wherein A comprises any one of molybdenum, chromium, tungsten, iron, ruthenium, osmium, cobalt, rhodium, aluminum, gallium, indium, arsenic, or phosphorus, and B comprises a chalcogen element.

10. The light emitting device of claim 6, wherein a chemical formula of the inorganic ligand comprises $M_zJ_x^{y-}$;

wherein M is a metal element, J is a chalcogen element, and all of x, y and z are positive integers.

11. The light emitting device of claim 10, wherein M comprises any one of germanium, tin, lead, stibium, or bismuth, and J comprises oxygen element.

12. The light emitting device of claim 1, wherein the quantum dot film layers other than the quantum dot film layers comprising the carrier auxiliary ligands further comprise organic ligands, each of which is configured to be attached to a surface of a body of the quantum dot.

13. The light emitting device of claim 1, wherein the initial organic ligands comprise any one of a first organic ligand or a third organic ligand:

wherein a structural formula of the first organic ligand is

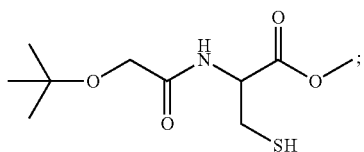 [SMILES: COC(=O)C(CS)NC(=O)COC(C)(C)C]

and a structural formula of the third organic ligand is

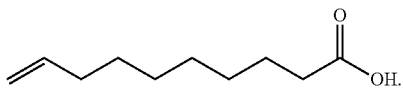

14. The light emitting device of claim 1, further comprising:
a first electrode between the substrate and the first carrier transport layer; and
a second electrode on a side of the second carrier transport layer away from the substrate;
wherein one of the first carrier transport layer and the second carrier transport layer is an electron transport layer, and the other of the first carrier transport layer and the second carrier transport layer is a hole transport layer.

15. A display substrate, comprising a plurality of pixel units, each of which comprises a plurality of light emitting devices, wherein each of the plurality of light emitting devices is the light emitting device of claim 1.

16. A display apparatus, comprising the display substrate of claim 15.

17. A method for manufacturing a light emitting device, comprising:
providing a substrate;
forming a first carrier transport layer on a side of the substrate;
forming a light emitting layer on a side of the first carrier transport layer away from the substrate; and
forming a second carrier transport layer on a side of the light emitting layer away from the first carrier transport layer;
wherein the light emitting layer comprises at least two quantum dot film layers, and each of the at least two quantum dot film layers comprises quantum dots; and
the quantum dot film layer of the at least two quantum dot film layers close to the first carrier transport layer further comprises carrier auxiliary ligands, each of which is configured to be attached to a surface of a body of the quantum dot, and/or the quantum dot film layer of the at least two quantum dot film layers close to the second carrier transport layer further comprises carrier auxiliary ligands, each of which is configured to be attached to a surface of a body of the quantum dot,
wherein the carrier auxiliary ligands in either the quantum dot film layer close to the first carrier transport layer or the quantum dot film layer close to the second carrier transport layer comprise inorganic ligands, which are formed on surfaces of bodies of the quantum dots in a manner in which:
a photo-acid generator and initial organic ligands attached to the surfaces of the bodies of the quantum dots react under an illumination environment to generate inorganic ions, and the inorganic ions are formed on the surfaces of the bodies of the quantum dots in a ligand exchange mode.

18. The method of claim 17, wherein in response to that any quantum dot film layer of the at least two quantum dot film layers has organic ligands attached to surfaces of bodies of the quantum dots, the quantum dot film layer is formed by:
forming a quantum dot solution comprising initial organic ligands attached to the surfaces of the bodies of the quantum dots; and
causing the initial organic ligands attached to the surfaces of the bodies of the quantum dots to be subjected to a reaction, under an illumination environment, by improving solubility or through crosslinking, to form the quantum dot film layer.

19. A method for manufacturing a light emitting device, comprising:
providing a substrate;
forming a first carrier transport layer on a side of the substrate;
forming a light emitting layer on a side of the first carrier transport layer away from the substrate; and
forming a second carrier transport layer on a side of the light emitting layer away from the first carrier transport layer;
wherein the light emitting layer comprises at least two quantum dot film layers, and each of the at least two quantum dot film layers comprises quantum dots; and
the quantum dot film layer of the at least two quantum dot film layers close to the first carrier transport layer further comprises carrier auxiliary ligands, each of which is configured to be attached to a surface of a body of the quantum dot, and/or the quantum dot film layer of the at least two quantum dot film layers close to the second carrier transport layer further comprises carrier auxiliary ligands, each of which is configured to be attached to a surface of a body of the quantum dot,
wherein in response to that any quantum dot film layer of the at least two quantum dot film layers has organic ligands attached to surfaces of bodies of the quantum dots, the quantum dot film layer is formed by:
forming a quantum dot solution comprising initial organic ligands attached to the surfaces of the bodies of the quantum dots; and
causing the initial organic ligands attached to the surfaces of the bodies of the quantum dots to be subjected to a reaction, under an illumination environment, by improving solubility or through crosslinking, to form the quantum dot film layer.

* * * * *